United States Patent
Skeoch et al.

(10) Patent No.: US 11,102,457 B1
(45) Date of Patent: Aug. 24, 2021

(54) AUDIO/VIDEO RECORDING AND COMMUNICATION DOORBELL DEVICES

(71) Applicant: AMAZON TECHNOLOGIES, INC., Seattle, WA (US)

(72) Inventors: James Steven Skeoch, Palos Verdes Estates, CA (US); Robert Tso, Los Angeles, CA (US); Chih-Jung Lin, New Taipei (TW)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/820,068

(22) Filed: Mar. 16, 2020

Related U.S. Application Data

(63) Continuation of application No. 16/213,870, filed on Dec. 7, 2018, now Pat. No. 10,638,097.

(51) Int. Cl.
| | | |
|---|---|---|
| *G08B 3/10* | (2006.01) | |
| *H03K 17/965* | (2006.01) | |
| *H04N 7/18* | (2006.01) | |
| *H04N 5/232* | (2006.01) | |

(52) U.S. Cl.
CPC ............. *H04N 7/186* (2013.01); *G08B 3/10* (2013.01); *H03K 17/965* (2013.01); *H04N 5/23241* (2013.01); *H03K 2217/0081* (2013.01); *H03K 2217/9651* (2013.01)

(58) Field of Classification Search
CPC ... H03K 2217/9651; H03K 2217/0081; H03K 17/965; H04N 7/186; H04N 5/23241; G08B 3/10
See application file for complete search history.

(56) References Cited

U.S. PATENT DOCUMENTS

| | | |
|---|---|---|
| 4,764,953 A | 8/1988 | Chern et al. |
| 5,428,388 A | 6/1995 | Von Bauer et al. |
| 5,760,848 A | 6/1998 | Cho |
| 6,072,402 A | 6/2000 | Kniffin et al. |
| 6,192,257 B1 | 2/2001 | Ray |
| 6,271,752 B1 | 8/2001 | Vaios |
| 6,429,893 B1 | 8/2002 | Xin |
| 6,456,322 B1 | 9/2002 | Marinacci |
| 6,476,858 B1 | 11/2002 | Ramirez Diaz et al. |
| 6,633,231 B1 | 10/2003 | Okamoto et al. |

(Continued)

FOREIGN PATENT DOCUMENTS

| | | |
|---|---|---|
| CN | 2585521 Y | 11/2003 |
| CN | 2792061 Y | 6/2006 |

(Continued)

*Primary Examiner* — Tsion B Owens
(74) *Attorney, Agent, or Firm* — Lathrop GPM LLP

(57) ABSTRACT

An audio/video (A/V) recording and communication doorbell device includes an input port, a switch, a first power supply, a second power supply, a button, a first controller, and a second controller. The switch is electrically coupled across the input port. The first power supply receives power from the input port and powers a first power supply rail, and the second power supply powers a second power supply rail. The button, when pressed, activates a signaling device. The first controller is at least partially powered from the first power supply rail and closes the switch in response to the button being pressed. The second controller is at least partially powered from the second power supply rail.

20 Claims, 11 Drawing Sheets

(56) References Cited

U.S. PATENT DOCUMENTS

| | | |
|---|---|---|
| 6,658,091 B1 | 12/2003 | Naidoo et al. |
| 6,753,774 B2 | 6/2004 | Pan et al. |
| 6,970,183 B1 | 11/2005 | Monroe |
| 7,062,291 B2 | 6/2006 | Ryley et al. |
| 7,065,196 B2 | 6/2006 | Lee |
| 7,085,361 B2 | 6/2006 | Lee |
| 7,109,860 B2 | 9/2006 | Wang |
| 7,193,644 B2 | 3/2007 | Carter |
| 7,304,572 B2 | 12/2007 | Sheynman et al. |
| 7,382,249 B2 | 6/2008 | Fancella |
| 7,450,638 B2 | 11/2008 | Iwamura |
| 7,643,056 B2 | 1/2010 | Silsby |
| 7,683,924 B2 | 3/2010 | Oh et al. |
| 7,683,929 B2 | 3/2010 | Elazar et al. |
| 7,738,917 B2 | 6/2010 | Ryley et al. |
| 8,139,098 B2 | 3/2012 | Carter |
| 8,144,183 B2 | 3/2012 | Carter |
| 8,154,581 B2 | 4/2012 | Carter |
| 8,619,136 B2 | 12/2013 | Howarter et al. |
| 8,780,201 B1 | 7/2014 | Scalisi et al. |
| 8,823,795 B1 | 9/2014 | Scalisi et al. |
| 8,842,180 B1 | 9/2014 | Kasmir et al. |
| 8,872,915 B1 | 10/2014 | Scalisi et al. |
| 8,937,659 B1 | 1/2015 | Scalisi et al. |
| 8,941,736 B1 | 1/2015 | Scalisi |
| 8,947,530 B1 | 2/2015 | Scalisi |
| 8,953,040 B1 | 2/2015 | Scalisi et al. |
| 9,013,575 B2 | 4/2015 | Scalisi |
| 9,049,352 B2 | 6/2015 | Scalisi et al. |
| 9,053,622 B2 | 6/2015 | Scalisi |
| 9,058,738 B1 | 6/2015 | Scalisi |
| 9,060,103 B2 | 6/2015 | Scalisi |
| 9,060,104 B2 | 6/2015 | Scalisi |
| 9,065,987 B2 | 6/2015 | Kasmir et al. |
| 9,094,584 B2 | 7/2015 | Scalisi et al. |
| 9,113,051 B1 | 8/2015 | Scalisi |
| 9,113,052 B1 | 8/2015 | Scalisi et al. |
| 9,118,819 B1 | 8/2015 | Scalisi et al. |
| 9,142,214 B2 | 9/2015 | Scalisi |
| 9,160,987 B1 | 10/2015 | Kasmir et al. |
| 9,165,444 B1 | 10/2015 | Scalisi |
| 9,172,920 B1 | 10/2015 | Kasmir et al. |
| 9,172,921 B1 | 10/2015 | Scalisi et al. |
| 9,172,922 B1 | 10/2015 | Kasmir et al. |
| 9,179,107 B1 | 11/2015 | Scalisi et al. |
| 9,179,108 B1 | 11/2015 | Scalisi et al. |
| 9,179,109 B1 | 11/2015 | Kasmir et al. |
| 9,196,133 B2 | 11/2015 | Scalisi et al. |
| 9,197,867 B1 | 11/2015 | Scalisi et al. |
| 9,230,424 B1 | 1/2016 | Scalisi et al. |
| 9,237,318 B2 | 1/2016 | Kasmir et al. |
| 9,247,219 B2 | 1/2016 | Kasmir et al. |
| 9,253,455 B1 | 2/2016 | Harrison et al. |
| 9,342,936 B2 | 5/2016 | Scalisi |
| 9,508,239 B1 | 11/2016 | Harrison et al. |
| 9,736,284 B2 | 8/2017 | Scalisi et al. |
| 9,743,049 B2 | 8/2017 | Scalisi et al. |
| 9,769,435 B2 | 9/2017 | Scalisi et al. |
| 9,786,133 B2 | 10/2017 | Harrison et al. |
| 9,799,183 B2 | 10/2017 | Harrison et al. |
| 10,142,542 B2 * | 11/2018 | Bracy .................... G08B 5/36 |
| 10,397,528 B2 * | 8/2019 | Siminoff .......... G08B 13/19656 |
| 2002/0094111 A1 | 7/2002 | Puchek et al. |
| 2002/0147982 A1 | 10/2002 | Naidoo et al. |
| 2003/0043047 A1 | 3/2003 | Braun |
| 2004/0085205 A1 | 5/2004 | Yeh |
| 2004/0085450 A1 | 5/2004 | Stuart |
| 2004/0086093 A1 | 5/2004 | Schranz |
| 2004/0095254 A1 | 5/2004 | Maruszczak |
| 2004/0135686 A1 | 7/2004 | Parker |
| 2005/0111660 A1 | 5/2005 | Hosoda |
| 2006/0010199 A1 | 1/2006 | Brailean et al. |
| 2006/0022816 A1 | 2/2006 | Yukawa |
| 2006/0139449 A1 | 6/2006 | Cheng et al. |
| 2006/0156361 A1 | 7/2006 | Wang et al. |
| 2013/0057695 A1 | 3/2013 | Huisking |
| 2015/0035987 A1 | 2/2015 | Fernandez |
| 2015/0120598 A1 * | 4/2015 | Fadell ................ G06Q 10/0631 |
| | | 705/333 |

FOREIGN PATENT DOCUMENTS

| | | |
|---|---|---|
| EP | 0944883 B1 | 6/1998 |
| EP | 1480462 A1 | 11/2004 |
| GB | 2286283 A | 8/1995 |
| GB | 2354394 A | 3/2001 |
| GB | 2357387 A | 6/2001 |
| GB | 2400958 A | 10/2004 |
| JP | 2001-103463 A2 | 4/2001 |
| JP | 2002-033839 A2 | 1/2002 |
| JP | 2002-125059 A2 | 4/2002 |
| JP | 2002-342863 A2 | 11/2002 |
| JP | 2002-344640 A2 | 11/2002 |
| JP | 2002-354137 A2 | 12/2002 |
| JP | 2002-368890 A2 | 12/2002 |
| JP | 2003-283696 A2 | 10/2003 |
| JP | 2004-128835 A | 4/2004 |
| JP | 2005-341040 A | 12/2005 |
| JP | 2006-147650 A | 6/2006 |
| JP | 2006-262342 A | 9/2006 |
| JP | 09-008925 A | 1/2009 |
| WO | WO 199839894 A1 | 9/1998 |
| WO | WO 0113638 A1 | 2/2001 |
| WO | WO 200193220 A1 | 12/2001 |
| WO | WO 2002085019 A1 | 10/2002 |
| WO | WO 2003028375 A1 | 4/2003 |
| WO | WO 2003096696 A1 | 11/2003 |
| WO | WO 2006038760 A1 | 4/2006 |
| WO | WO 2006067782 A1 | 6/2006 |
| WO | WO 2007125143 A1 | 8/2007 |

* cited by examiner

AUDIO/VIDEO RECORDING AND COMMUNICATION DOORBELL DEVICES

RELATED APPLICATIONS

This application is a continuation of U.S. application Ser. No. 16/213,870 filed Dec. 7, 2018, the entire contents of which are incorporated herein by reference.

TECHNICAL FIELD

The present embodiments relate to audio/video (A/V) recording and communication devices, including A/V recording and communication doorbells. In particular, the present embodiments relate to improvements in the functionality of A/V recording and communication devices that strengthen the ability of such devices to reduce crime and enhance public safety.

BACKGROUND

Home security is a concern for many homeowners and renters. Those seeking to protect or monitor their homes often wish to have video and audio communications with visitors, for example, those visiting an external door or entryway. A/V recording and communication devices, such as doorbells, provide this functionality, and can also aid in crime detection and prevention. For example, audio and/or video captured by an A/V recording and communication device can be uploaded to the cloud and recorded on a remote server. Subsequent review of the A/V footage can aid law enforcement in capturing perpetrators of home burglaries and other crimes. Further, the presence of one or more A/V recording and communication devices on the exterior of a home, such as a doorbell unit at the entrance to the home, acts as a powerful deterrent against would-be burglars.

BRIEF DESCRIPTION OF THE DRAWINGS

The various embodiments of the present A/V recording and communication doorbell devices now will be discussed in detail with an emphasis on highlighting the advantageous features. These embodiments depict the novel and non-obvious A/V recording and communication doorbell devices shown in the accompanying drawings, which are for illustrative purposes only. These drawings include the following figures, in which like numerals indicate like parts.

DETAILED DESCRIPTION

Figure 1:
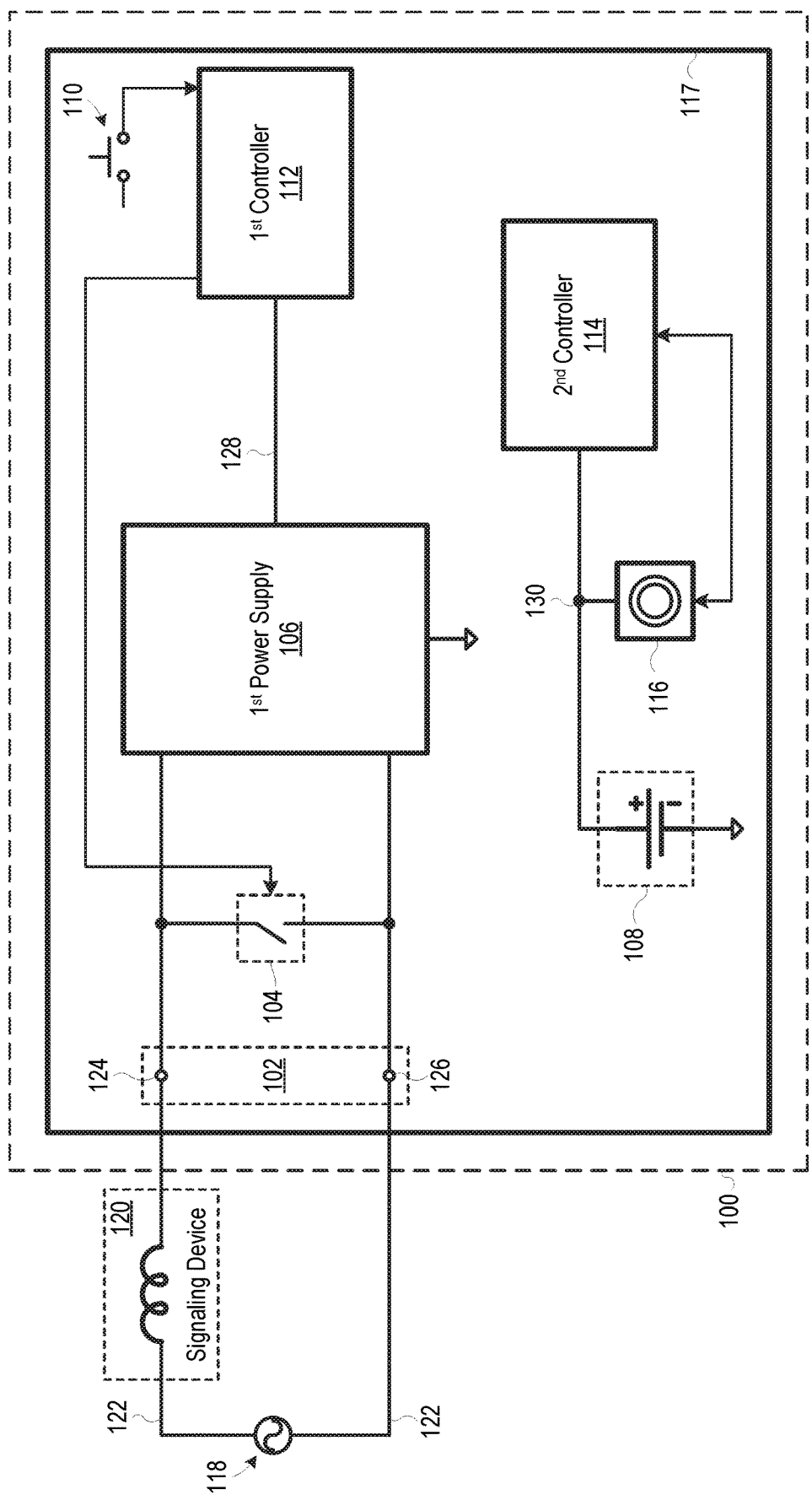
FIG. 1 is a schematic diagram of an example of an electrical circuit including an A/V recording and communication doorbell device, according to various aspects of the present disclosure.

One aspect of the present embodiments includes the realization that an A/V recording and communication doorbell device ("A/V doorbell") may be temporarily unable to activate a signaling device. For example, a processor of the A/V doorbell may be off-line during a firmware update, such that the processor is unable to activate the signaling device in response to pressing of a button of the A/V doorbell. As another example, the A/V doorbell may be powered by an on-board battery, and the battery may be discharged, such that the A/V doorbell is temporarily non-operational and therefore cannot activate the signaling device. Such temporary inability of the A/V doorbell to activate a signaling device may cause user inconvenience.

The present embodiments solve these problems, for example, by providing an A/V doorbell including two power supplies and two controllers, e.g., a first power supply, a second power supply, a first controller, and a second controller, to promote robust signaling device activation. The first power supply at least partially powers the first controller, e.g., a signaling device controller, and the second power supply at least partially powers the second controller, e.g., an A/V controller. In particular embodiments, the first controller operates independently of the second power supply and the second controller, and the first controller activates the signaling device in response to the button being pressed, irrespective of whether the second power supply and the second controller are operational. For example, in an embodiment where the second power supply is an on-board battery, the first controller activates the signaling device in response to the button being pressed even if the battery is completely discharged. As another example, in an embodiment where the second controller is an A/V controller, the first controller activates the signaling device in response to the button being pressed even if the A/V controller is temporarily unavailable, such as due to its firmware being updated.

Another aspect of the present embodiments includes the realization that an A/V doorbell may be unable to receive electrical power from an external electrical power source while activating a signaling device. For example, the A/V doorbell may activate the signaling device by closing a switch across an input port of the A/V doorbell, to provide a low-impedance path between the signaling device and an external electrical power source, e.g., a transformer. Closing the switch across the input port prevents the A/V doorbell from receiving electrical power from the external electrical power source, potentially requiring that the A/V doorbell have large energy storage capacity for powering the A/V doorbell while the switch is closed. Such large energy storage capacity requirement may undesirably necessitate use of a relatively costly and/or large energy storage device in the A/V doorbell.

The present embodiments solve this problem, for example, by providing an A/V doorbell including a controller that repeatedly opens and closes a switch across an input port, to enable powering of the A/V doorbell while activating a signaling device. In these embodiments, the controller closes the switch in response to a button of the A/V doorbell being pressed, to cause a signaling device to activate. The controller then repeatedly opens and closes the switch in response to a power supply voltage crossing a threshold value, to alternate between activating the signaling device and receiving electrical power at the A/V doorbell, to help reduce energy storage capacity requirements of the A/V doorbell.

Another aspect of the present embodiments includes the realization that a type of signaling device connected to an A/V doorbell, as well as a type of external electrical power source powering the A/V doorbell, may be unknown, particularly when the A/V doorbell is being installed or set up for the first time. For example, it may not be known whether the A/V doorbell is connected to a mechanical signaling device or to an electronic signaling device. As another example, it may not be known whether the A/V doorbell is powered from an alternating current (AC) electrical power source or from a direct current (DC) electrical power source. Such lack of knowledge regarding the signaling device type and/or the electrical power source type may cause inconvenience when configuring and/or troubleshooting the A/V doorbell. For example, a user installing an A/V doorbell may not know whether the A/V doorbell is connected to a mechanical signaling device or to an electronic signaling device, and the user may therefore incorrectly configure the A/V doorbell. As another example, a party remotely diagnosing a reported issue with the A/V doorbell may be unable to completely diagnose the issue without knowledge of the electrical power source type.

The present embodiments solve this problem, for example, by providing an A/V doorbell including a first switch, a second switch, and a resistor. In some embodiments, the first switch and the resistor are electrically coupled in series across an input port, and the second switch is electrically coupled in parallel with the resistor. In other embodiments, the first switch is electrically coupled across the input port, and the resistor and the second switch are electrically coupled in series across the input port and in parallel with the first switch. The resistor and the switches are used, for example, to determine one or more characteristics of an electrical circuit including the A/V doorbell. In particular embodiments, a controller closes the second switch in a first operating mode of the A/V doorbell and opens the second switch in a second operating mode of the A/V doorbell. In other embodiments, the controller opens the second switch in the first operating mode of the A/V doorbell and closes the second switch in the second operating mode of the A/V doorbell. In some embodiments, the controller determines a characteristic of the electrical circuit including the A/V doorbell at least partially from respective voltage and/or current values sampled in each of the first and second operating modes. The characteristic of the electrical circuit may be, for example, a type of signaling device connected to the A/V doorbell and/or a type of external electrical power source powering the A/V doorbell.

The remaining detailed description describes the present embodiments with reference to the drawings. In the drawings, reference numbers label elements of the present embodiments. These reference numbers are reproduced below in connection with the discussion of the corresponding drawing features.

FIG. 1 is a schematic diagram of an electrical circuit including an A/V recording and communication doorbell device ("A/V doorbell") 100, according to various aspects of the present disclosure. The A/V doorbell 100 includes an input port 102, a switch 104, a first power supply 106, a second power supply 108, a button 110, a first controller 112, a second controller 114, and a camera 116. In particular embodiments, the input port 102, the switch 104, the first power supply 106, the second power supply 108, the button 110, the first controller 112, the second controller 114, and the camera 116 are at least partially housed in a common case 117. The input port 102 includes a first terminal 124 and a second terminal 126 for electrically coupling to an external electrical power source. In various embodiments, the first terminal 124 and the second terminal 126 may comprise, for example, one or more of a screw terminal connector, a pressure terminal connector, a solder terminal connector, a connector cable, or any other type of terminal. For example, the input port 102 may be electrically coupled to an alternating current (AC) electrical power source 118 and a signaling device 120 via wiring 122, as illustrated in FIG. 1. In these embodiments, the A/V doorbell 100 activates the signaling device 120, e.g., to cause the signaling device 120 to output sound, when a user presses the button 110 of the A/V doorbell 100, as discussed below. In some embodiments, the A/V doorbell 100 is located at a premises (e.g., a home), with the A/V doorbell 100 being located outside the home (e.g., next to a front door). In other embodiments, the A/V doorbell 100 may be inside the home.

The AC electrical power source 118 provides electrical power to the A/V doorbell 100 and the signaling device 120. For example, the AC electrical power source 118 may be a transformer, such as a step-down transformer, having a primary winding that is electrically coupled to an external AC electrical power source (e.g., AC mains power supply), and a secondary winding that is electrically coupled in series with the A/V doorbell 100 and the signaling device 120 via the wiring 122. The transformer may step down the voltage from the external AC electrical power source from, for example, a high voltage (e.g., 120 volts) to a lower voltage, such as 16 volts to 24 volts. In some embodiments, the AC electrical power source 118 may be replaced with a direct current (DC) electrical power source, such as a battery and/or a photovoltaic device (e.g., a solar panel).

The signaling device 120 is symbolically depicted herein as a solenoid coil. In particular embodiments, the signaling device 120 outputs sound and/or light, when activated. In some embodiments, the signaling device 120 may be, for example, a mechanical signaling device or an electronic signaling device. A mechanical signaling device creates its sound by using a physical bell (or metal bars, or the like) and a mechanical hammer, and makes a traditional "ding-dong" sound. An electronic signaling device plays pre-recorded digital tones (e.g., a melody) through a speaker, and may have a selection of different tones for the user to choose from. Although the AC electrical power source 118 and the signaling device 120 are illustrated as being external to the A/V doorbell 100, in an alternate embodiment one or more of the AC electrical power source 118 and the signaling device 120 are integrated within the A/V doorbell 100.

An activation time for a mechanical signaling device (e.g., a duration during which the mechanical signaling device is powered on) is typically short, just long enough to move the hammer to contact the metal bars to produce the "ding-dong" sound. An activation time of less than one second (e.g., 0.5 seconds) is typical for a mechanical signaling device. By contrast, an activation time for an electronic signaling device is longer, because an electronic signaling device typically plays a melody that can last for five seconds or more, such as ten seconds or fifteen seconds. During this longer activation time, the electronic signaling device is drawing power. The power draw for an electronic signaling device thus typically has a much longer duration than the power draw for a mechanical signaling device.

The switch 104 is electrically coupled across the input port 102, e.g., between the first terminal 124 and the second terminal 126. In some embodiments, the switch 104 includes a bidirectional triode thyristor, such as discussed below with respect to FIG. 9. In other embodiments, the switch 104 includes one or more transistors, such as discussed below with respect to FIG. 10. As discussed below, the first controller 112 is operably connected to and controls the switch 104, e.g., to cause the switch 104 to open and close.

Figure 2:
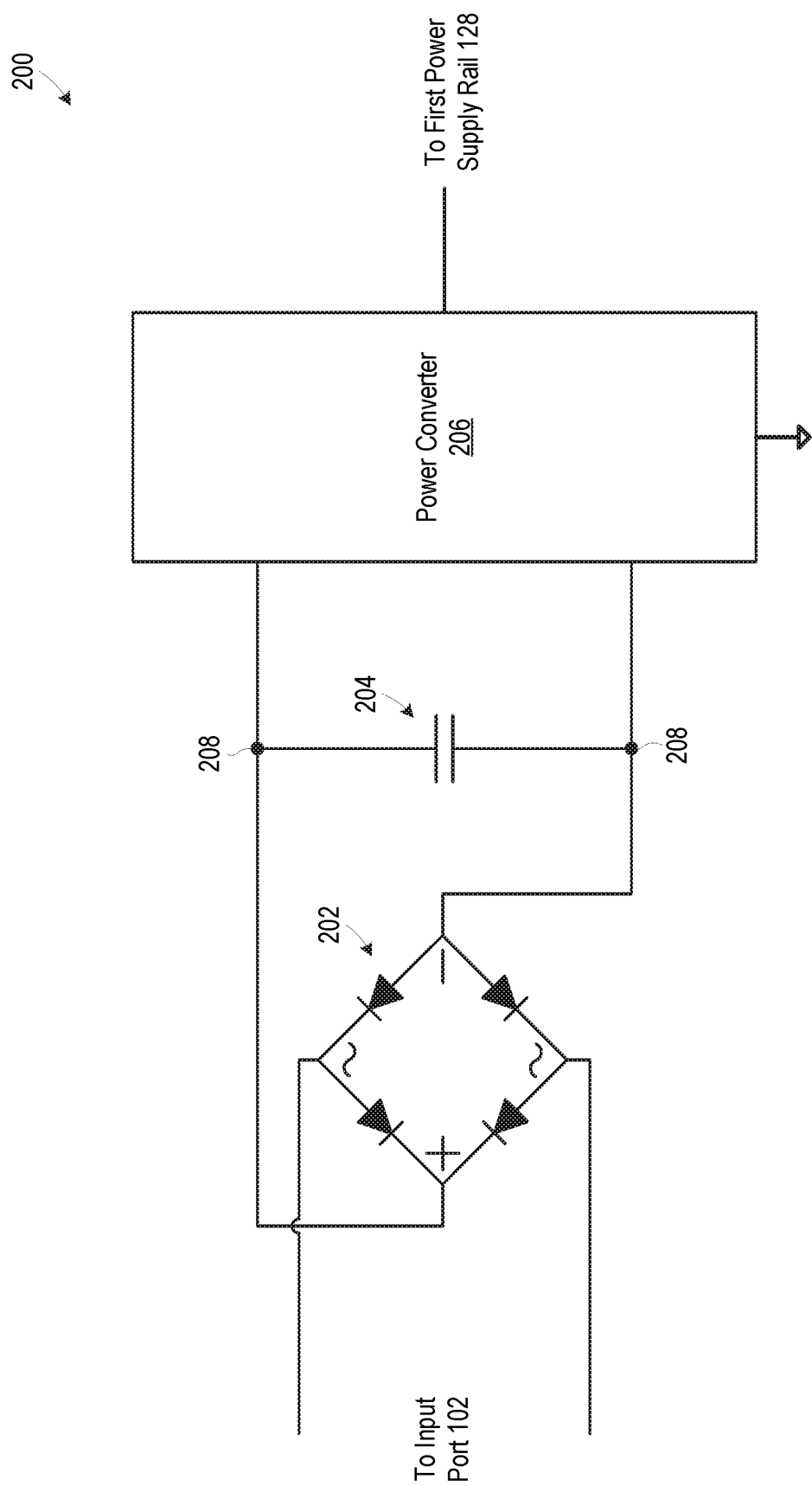
FIG. 2 is a schematic diagram of a power supply, according to various aspects of the present disclosure.

The first power supply 106 receives electrical power from the input port 102 and delivers power to a first power supply rail 128. In some embodiments, the first power supply 106 includes a rectifier to rectify AC electrical power, e.g., electrical power from the input port 102, and a power converter to regulate the rectified electrical power. For example, FIG. 2 is a schematic diagram of a power supply 200, which is one possible embodiment of the first power supply 106. The power supply 200 includes a bridge rectifier 202, a capacitor 204, and a power converter 206. The bridge rectifier 202 is electrically coupled between the input port 102 and a DC power rail 208, such that a DC output of the bridge rectifier 208 is electrically coupled to the DC power rail 208. The bridge rectifier 202 rectifies AC electrical power received from the input port 102 into rectified electrical power on the DC power rail 208. In embodiments where the input port 102 is electrically coupled to a DC electrical power source instead of to an AC electrical power source, the bridge rectifier electrically couples DC electric power from the input port 102 to the DC power rail 208. The bridge rectifier 202 may be omitted in embodiments where the input port 102 is electrically coupled to a DC electrical power source. In alternative embodiments, the power supply 200 may have different structure than as shown in FIG. 2. For example, the power supply 200 may comprise a flyback transformer, a high voltage LDO (low dropout) regulator, a thyristor-type converter, etc.

The capacitor 204 is electrically coupled across the DC power rail 208. The capacitor 204 helps filter ripple current on the DC power rail 208, and the capacitor 204 may also help the power supply 200 continue to power the first power supply rail 128 while the switch 104 is closed. The power converter 206 is electrically coupled between the DC power rail 208 and the first power supply rail 128. The power converter 206 converts rectified electrical power on the DC power rail 208 into a form suitable for loads powered by the first power supply rail 128, e.g., into a form suitable for powering the first controller 112. For example, in some embodiments, the power converter 206 regulates voltage on the first power supply rail 128. In particular embodiments, the power converter 206 includes one or more of a linear regulator and a switching converter. A linear regulator achieves voltage regulation by dropping voltage across a pass element, such as a transistor operating in its linear region, and a switching converter achieves voltage regulation by charging and discharging one or more energy storage elements, such as an inductor and/or a capacitor.

Figure 3:
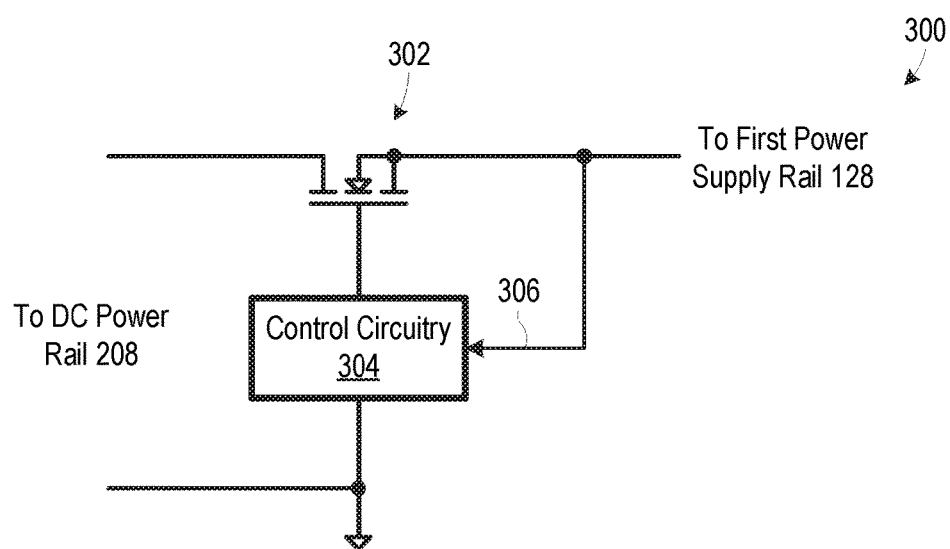
FIG. 3 is a schematic diagram of a linear regulator, according to various aspects of the present disclosure.

FIG. 3 is a schematic diagram of one example of a linear regulator 300, which is one possible embodiment of the power converter 206. The linear regulator 300 includes a transistor 302 and control circuitry 304. The transistor 302 is electrically coupled between the DC power rail 208 and the first power supply rail 128. The control circuitry 304 controls the transistor 302 such that the transistor 302 operates in its linear region to drop voltage as required to regulate voltage on the first power supply rail 128. In some embodiments, the control circuitry 304 samples voltage on the first power supply rail 128 via a feedback connection 306, to form a closed loop for regulating voltage on the first power supply rail 128. Although the transistor 302 is illustrated as being an enhancement mode n-channel metal oxide semiconductor field effect transistor (MOSFET), the transistor 302 could be a different type of transistor, e.g., a p-channel MOSFET, a depletion mode MOSFET, a bipolar junction transistor (BJT), or any other type of transistor without departing from the scope hereof.

Figure 4:
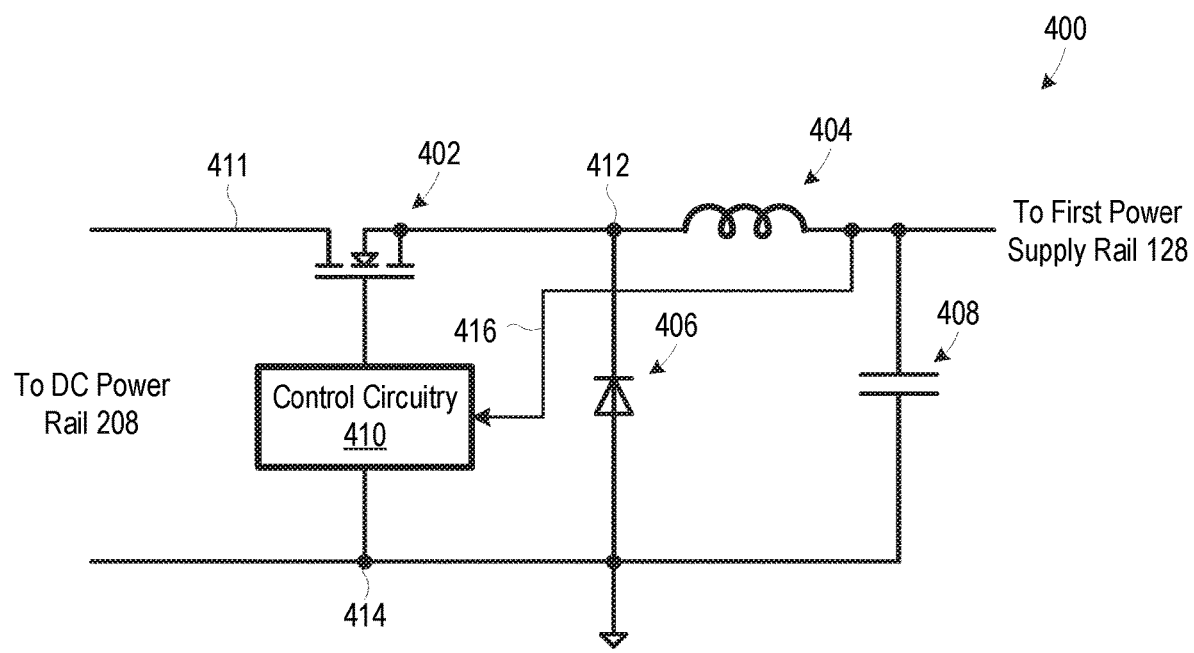
FIG. 4 is a schematic diagram of a switching converter, according to various aspects of the present disclosure.

FIG. 4 is a schematic diagram of one example of a switching converter 400, which is another possible embodiment of the power converter 206. The switching converter 400 includes a transistor 402, an inductor 404, a catch diode 406, a capacitor 408, and control circuitry 410. The transistor 402 is electrically coupled between a positive node 411 of the DC power rail 208 and a switching node 412, and the inductor 404 is electrically coupled between the switching node 412 and the first power supply rail 128. The catch diode 406 is electrically coupled between a reference node 414 of the DC power rail 208 and the switching node 412, and the capacitor 408 is electrically coupled between the first power supply rail 128 and the reference node 414. The control circuitry 410 causes the transistor 402 to repeatedly switch between its on and off states, such that the switching converter 400 operates as a buck converter. In some embodiments, the control circuitry 410 samples voltage on the first power supply rail 128 via a feedback connection 416, to form a closed loop for regulating voltage on the first power supply rail 128. Although the transistor 402 is illustrated as being an enhancement mode n-channel MOSFET, the transistor 402 could be a different type of transistor, e.g., a p-channel MOSFET, a depletion mode MOSFET, a BJT, or any other type of transistor without departing from the scope hereof.

The switching converter 400 may have a different topology without departing from the scope hereof. For example, in an alternate embodiment, the switching converter 400 has one of the following topologies: a boost topology, a buck-boost topology, a buck and boost topology, a auk topology, a switched-capacitor topology, a forward topology, a flyback topology, a half-bridge topology, a full-bridge topology, or any other suitable topology.

As discussed above, some A/V doorbells include an on-board battery that provides power for all components of the A/V doorbell. When used as a replacement for a traditional doorbell button, the old button is disconnected from the AC wiring, and the wires are then connected to terminals of the A/V doorbell. The on-board battery receives power from the AC wiring, for example to trickle charge the battery, and the battery provides power for all components of the A/V doorbell. The button of the A/V doorbell, when pressed, sends a signal to a processor of the A/V doorbell, which in turn outputs a signal that causes the sound output device that was formerly connected to the old doorbell button to sound. Unfortunately, with an A/V doorbell that is configured in this fashion, if the on-board battery is completely discharged (e.g., because the battery has reached its end of life), or if the processor is malfunctioning or is unavailable (for example because it is undergoing a firmware update), no signal can be sent from the A/V doorbell to the sound output device. Thus, if a visitor presses the button of the A/V doorbell when either the on-board battery is completely discharged, or the processor is malfunctioning or is unavailable, the sound output device will not sound. The present embodiments solve these problems, as outlined below.

Referring again to FIG. 1, the first controller 112 is communicatively coupled to the button 110, and is at least partially powered from the first power supply rail 128. The first controller 112 includes, for example, analog electronic circuitry, digital electronic circuitry, or a combination of analog and digital electronic circuitry. In some embodiments, the first controller 112 includes a processor (not shown) for executing instructions in the form of firmware and/or software stored in a memory (not shown). The button 110, when pressed, causes the signaling device 120 to activate. In particular, the first controller 112 causes the switch 104 to close in response to the button 110 being pressed. Closing the switch 104 electrically shorts the input port 102, thereby increasing electrical power to the signaling device 120, which activates the signaling device 120. The button 110 is, for example, one or more of a mechanical button, a capacitive touch button, a resistive touch button, a surface acoustic wave (SAW) button, an infrared (IR) button, an optical imaging button, an acoustic pulse recognition button, and a button that implements a low-power computer vision module (CVM) for the detection of a person (e.g., a finger, a hand, etc., of a person).

The second power supply 108 powers a second power supply rail 130. In some embodiments, the second power supply 108 is a battery, such as illustrated in FIG. 1. However, the second power supply 108 may have a different configuration without departing from the scope hereof. For example, in some other embodiments, the second power supply 108 includes one or more of an energy storage capacitor (e.g., a supercapacitor), a photovoltaic device (e.g., a solar panel), a linear regulator, and/or a switching converter, in addition to or in place of a battery. The second power supply 108 may, in some embodiments, receive electrical power from the input port 102 and/or from the first power supply rail 128. For example, in some embodiments where the second power supply 108 is a battery, the A/V doorbell 100 includes circuitry (not shown) to charge the battery from electrical power received from the input port 102.

The second controller 114 and the camera 116 are each at least partially powered from the second power supply rail 130. The second controller 114 includes, for example, analog electronic circuitry, digital electronic circuitry, or a combination of analog and digital electronic circuitry. In some embodiments, the second controller 114 includes a processor (not shown) configured to execute instructions in the form of firmware and/or software stored in a memory (not shown). The second controller 114 may at least partially control the camera 116. The camera 116 captures (e.g., generates) image data (e.g., still images, video images, etc.) representing an image of a scene in a field of view of the camera 116.

In various embodiments, the first controller 112 and the second controller 114 may be communicatively coupled to one another, such as via a signal bus (not shown), which in some embodiments may be a UART (Universal Asynchronous Receiver/Transmitter) signal bus, or any other type of communication path. The communication path between the first controller 112 and the second controller 114 enables various signals to be sent between the two controllers. For example, the first controller 112 may send signals to the second controller 114 indicating events of various types that occur at the A/V doorbell 100, such as motion events (e.g., motion detected by a motion sensor of the A/V doorbell 100), pressing of the button 110, etc. The second controller 114, in response to signals received from the first controller 112, may take one or more actions. For example, a signal received from the first controller 112 indicating that motion has been detected by a motion sensor of the A/V doorbell 100 (or indicating that the button 110 has been pressed) may cause the second controller 114 to activate the camera 116 to record video, activate a microphone (not shown) to record audio, transmit the video and/or audio to a remote server using a communication module (e.g., a network interface (not shown)), etc. In another example, the first controller 112 may send signals to the second controller 114 indicating the type of signaling device 120 (e.g., mechanical or electronic) connected to the doorbell circuit. Information passed from the first controller 112 to the second controller 114 may be further transmitted to a network, such as via the network interface of the A/V doorbell 100 and a local network to which the A/V doorbell 100 is connected and/or via the Internet.

In certain embodiments, the first controller 112 operates independently of the second power supply 108 and the second controller 114, and the first controller 112 causes the switch 104 to close in response to the button 110 being pressed irrespective of whether the second power supply 108 and the second controller 114 are operational. For example, in these embodiments, the first controller 112 causes the switch 104 to close in response to the button 110 being pressed even if the battery of the second power supply 108 is drained and/or the second controller 114 is not operating. Consequently, the dual power supply and dual controller configuration of the A/V doorbell 100 promotes fault tolerance of the A/V doorbell 100.

In particular embodiments, the first controller 112 detects that the second power supply 108 and/or the second controller 114 is non-operational, and the first controller 112 may communicate detection of the non-operational second power supply 108 and/or second controller 114 to an external system. For example, in an embodiment where the second power supply 108 includes a battery, the first controller 112 may detect that the battery is drained and communicate detection of the drained battery to a remote system, e.g., to inform a user that the battery is drained so that the user can recharge the battery.

In some embodiments, reliable activation of the signaling device 120 is further promoted by limiting the functionality of the first controller 112, e.g., by limiting the first controller 112 to control of the switch 104 and related functions, to reduce possible failure points of the first controller 112. For example, in a particular embodiment, the first controller 112 is limited to controlling signaling device (e.g., non-A/V) aspects of the A/V doorbell 100, and the second controller 114 controls other (e.g., A/V) aspects of the A/V doorbell 100. In these embodiments, the first power supply rail 128 may be referred to as a signaling device power supply rail 128, the first controller 112 may be referred to as a signaling device controller 112, and the second controller 114 may be referred to as an A/V controller 114.

The A/V doorbell 100 may include additional components without departing from the scope hereof. For example, some embodiments of the A/V doorbell 100 further include a microphone and/or a communication module, such as discussed below with respect to FIG. 12. Additionally, the camera 116 may be replaced with another type of A/V device, such as a speaker, without departing from the scope hereof.

As discussed above, closing the switch 104, such as to activate the signaling device 120, electrically shorts the input port 102, thereby preventing the first power supply 106 from receiving electrical power from the input port 102. Consequently, closing the switch 104 to activate the signaling device 120 may interfere with the ability of the first power supply 106 to power the first power supply rail 128. When the signaling device 120 is a mechanical signaling device, the switch 104 remains closed for only a short time (e.g., less than a second), just long enough to provide sufficient power to the signaling device 120 to enable the mechanical signaling device to activate (e.g., to emit a "ding-dong" tone). However, when the signaling device 120 is an electronic signaling device, sufficient power must be provided to the signaling device 120 to enable the electronic signaling device to continue to play its melody, which may last for a few seconds or more (e.g., five seconds, or ten seconds, or fifteen seconds, or any other duration). If the switch 104 remains closed for this entire duration, an energy storage device of the first power supply 106 (e.g., the capacitor 204 of FIG. 2) will discharge completely before the electronic signaling device finishes playing its melody. This scenario would diminish the customer experience.

The present embodiments solve this problem by causing the switch 104 to repeatedly open and close when the button 110 is pressed, and when the signaling device 120 is an electronic signaling device, instead of continuously operating in its closed state for the duration of the melody played by the electronic signaling device. In particular, causing the switch 104 to repeatedly open and close causes the A/V doorbell 100 to alternate between enabling sufficient current flow to the signaling device 120 to activate the signaling device 120 (when the switch 104 is closed), and enabling the first power supply 106 to receive electrical power from the input port 102 (when the switch 104 is open). The first power supply 106 receives electrical power from the input port 102 while the switch 104 is open, and electrical power is stored in an energy storage device of the first power supply 106, e.g., in the capacitor 204 of FIG. 2, during this time. The energy stored in the energy storage device enables the first power supply 106 to continue to power the first power supply rail 128 while the switch 104 is closed, which in turn enables the electronic signaling device to continue to receive power for the duration of its activation time. Consequently, repeatedly opening and closing the switch 104 when the button 110 is pressed, and when the signaling device 120 is an electronic signaling device, enables the electronic signaling device to play its entire melody without completely discharging the energy storage device of the first power supply 106.

Accordingly, in certain embodiments, the first controller 112 causes the switch 104 to repeatedly open and close in response to the button 110 being pressed, when the signaling device 120 is an electronic signaling device. For example, in some embodiments, the first controller 112 causes the switch 104 to repeatedly open and close for an entire duration that the button 110 is pressed. As another example, in some other embodiments, the first controller 112 initially causes the switch 104 to continuously operate in its closed state for a limited time in response to the button 110 being pressed, and subsequently causes the switch 104 to repeatedly open and close in response to a voltage of the first power supply 106 crossing a threshold value, e.g., dropping below a minimum threshold value (e.g., 1.5 volts, 1.8 volts, 3.3 volts, or 5.0 volts), which indicates that an energy storage device of the first power supply 106 needs to be recharged. In some embodiments, the voltage of the first power supply 106 is a voltage on the first power supply rail 128. In some other embodiments, the voltage of the first power supply 106 is a voltage of an internal power rail of the first power supply 106, e.g., a voltage on the DC power rail 208 of FIG. 2. In particular embodiments, the first controller 112 causes the switch 104 to repeatedly open and close at a frequency that is sufficiently high (e.g., at least 50 Hz) to not perceptibly interfere with operation of the signaling device 120 (e.g., to not interfere with the playing of a melody by an electronic signaling device). For example, in some embodiments the first controller 112 causes the switch 104 to repeatedly open and close at the line frequency (e.g., the frequency of the AC electrical power source 118) to chop the waveform of electrical current flowing through the switch 104 between 0% and 20%, to divide power between the signaling device 120 and the first power supply 106.

Figure 5:
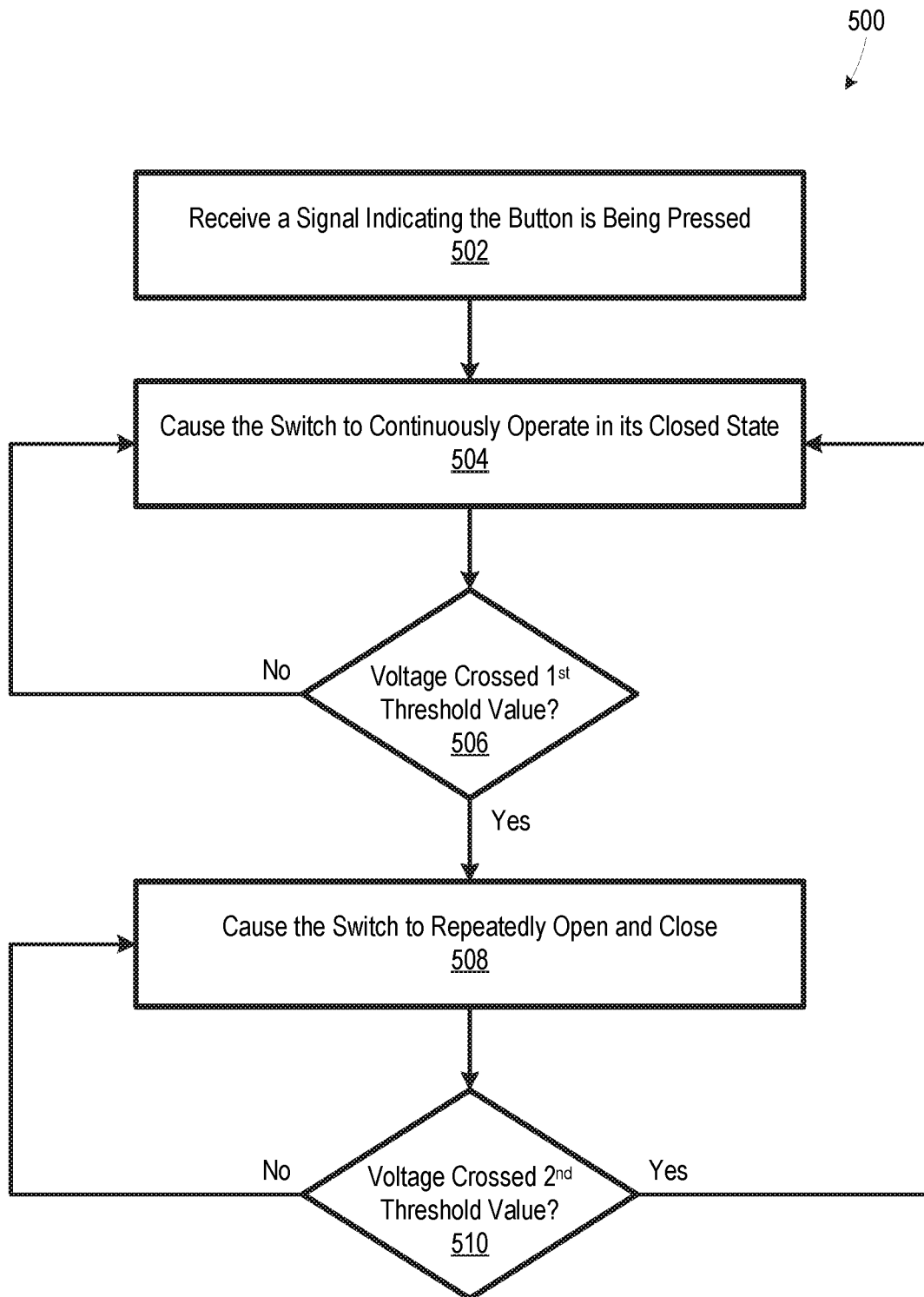
FIG. 5 is a flowchart illustrating an example process of activating a signaling device, according to various aspects of the present disclosure.

FIG. 5 is a flowchart illustrating an example process 500 performed by an A/V doorbell to activate a signaling device, according to various aspects of the present disclosure. In some embodiments, the process 500 may be performed when the signaling device 120 is an electronic signaling device. In other embodiments, the process 500 may be performed when the button 110 of the A/V doorbell 100 is held down for an extended period, regardless of whether the signaling device 120 is mechanical or electronic. At block 502, a signal is received indicating that a button of the A/V doorbell is being pressed. For example, the first controller 112 may receive a signal from the button 110 indicating that the button 110 is being pressed. At block 504, a switch of the A/V doorbell continuously operates in its closed state when the button is pressed, either because the button 110 is being held down or because the signaling device 120 is an electronic signaling device. For example, the first controller 112 may cause the switch 104 to continuously operate in its closed state. At block 506, a determination is made as to whether a first power supply voltage has crossed a first threshold value. For example, the first controller 112 may determine whether a voltage on the first power supply rail 128 or a voltage on the DC power rail 208 has crossed, e.g., dropped below, a first threshold value. If the first power supply voltage has not crossed the first threshold value, then the process returns to block 506. However, if the first power supply voltage has crossed the first threshold value, then the process advances to block 508.

At block 508, a switch of the A/V doorbell repeatedly opens and closes. For example, the first controller 112 may cause the switch 104 to repeatedly open and close. At block 510, a determination is made as to whether the first power supply voltage has crossed a second threshold value. For example, the first controller 112 may determine whether the voltage on the first power supply rail 128 or the voltage on the DC power rail 208 has crossed, e.g., risen above, a second threshold value. If the first power supply voltage has not crossed the second threshold value, then the process returns to block 508. However, if the first power supply voltage has crossed the second threshold value, then the process returns to block 504. In some embodiments, the first threshold value and the second threshold value are a common value, while in other embodiments the second threshold value is greater than the first threshold value, to achieve hysteresis. The process 500 continues, for example, as long as the button of the A/V recording and communication doorbell device remains pressed, or until the melody of the electronic signaling device continues to play (in embodiments in which the signaling device 120 is an electronic signaling device).

Figure 6:
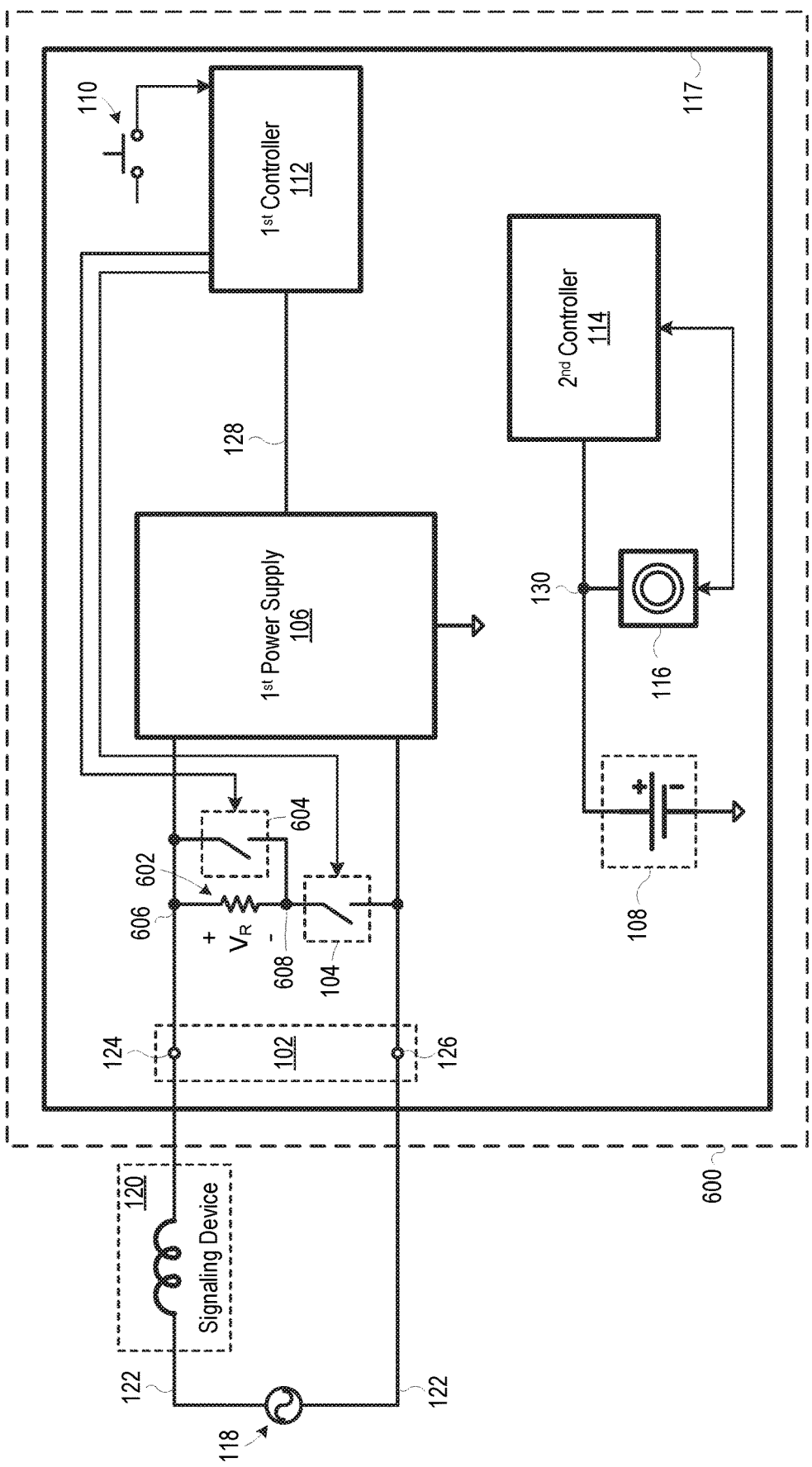
FIG. 6 is a schematic diagram of another example of an electrical circuit including an A/V recording and communication doorbell device, according to various aspects of the present disclosure.

FIG. 6 is a schematic diagram of an electrical circuit including an A/V recording and communication doorbell device ("A/V doorbell") 600, according to various aspects of the present disclosure. The A/V doorbell 600 is similar to the A/V doorbell 100 of FIG. 1, but further includes a resistor 602 and a second switch 604. In certain embodiments, some or all of the elements of the A/V doorbell 600 are at least partially housed in the case 117. The (first) switch 104 and the resistor 602 are electrically coupled in series across the input port 102, and the second switch 604 is electrically coupled in parallel with the resistor 602. In some embodiments, the second switch 604 includes a bidirectional triode thyristor, and in other embodiments, the second switch 604 includes one or more transistors. As discussed below, the first controller 112 controls the second switch 604, e.g., to cause the second switch 604 to open and close according to an operating mode of the A/V doorbell 600.

The A/V doorbell 600 has at least a first operating mode and a second operating mode. In the first operating mode, the first controller 112 causes the first switch 104 and the second switch 604 to be closed, and in the second operating mode, the first controller 112 causes the second switch 604 to be open and the first switch 104 to be closed. Accordingly, the resistor 602 is bypassed in the first operating mode, and the resistor 602 is electrically coupled across the output port 102 in the second operating mode. In particular embodiments, the first operating mode is a normal operating mode where the resistor 602 is bypassed to prevent power dissipation in the resistor, and the second operating mode is a training mode where the first controller 112 uses the resistor to determine one or more characteristics of the electrical circuit including the A/V doorbell 600. In some embodiments, the A/V doorbell 600 operates in the training mode during setup, start-up, configuration, or troubleshooting of the A/V doorbell 600, and the A/V doorbell 600 operates in the normal operating mode when not operating in the training operating mode.

The resistor 602 and the switch 104 are electrically coupled in series such that the resistor 602 is electrically coupled between a first node 606 and a second node 608 during the second operating mode. The first node 606 is electrically coupled to the first terminal 124 of the input port 102, and the second node 608 joins the resistor 602 and the switch 104, in the FIG. 6 example.

Figure 7:
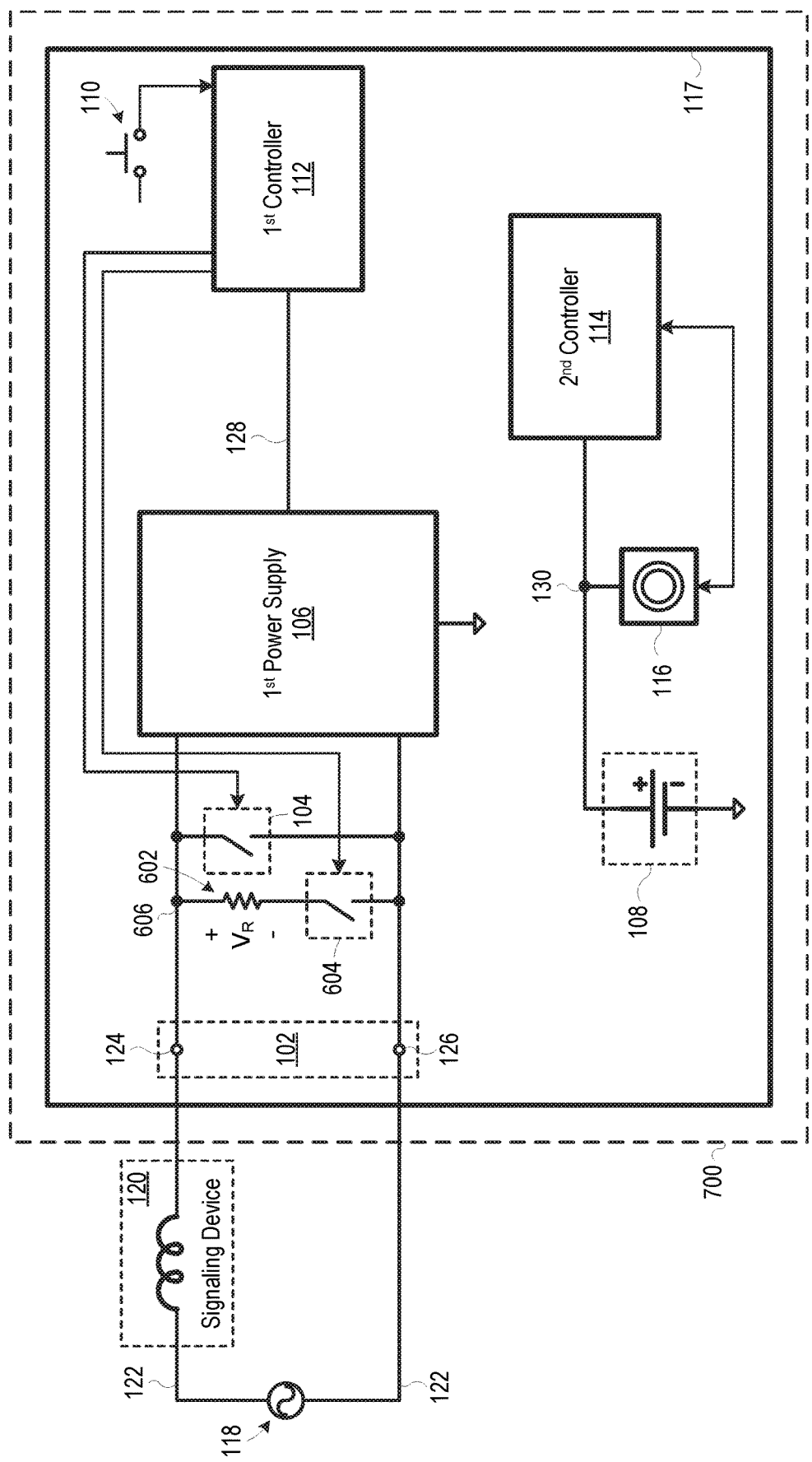
FIG. 7 is a schematic diagram of yet another example of an electrical circuit including an A/V recording and communication doorbell device, according to various aspects of the present disclosure.

The configuration of the first switch 104, the second switch 604, and the resistor 602 could be varied without departing from the scope hereof. For example, in an alternate embodiment, positions of the resistor 602 and the switch 104 are swapped such that the first node 606 is electrically coupled to the second terminal 126 of the input port 102. As another example, FIG. 7 is a schematic diagram of an electrical circuit including an A/V recording and communication doorbell device ("A/V doorbell") 700, according to various aspects of the present disclosure. The A/V doorbell 700 is similar to the A/V doorbell 600 of FIG. 6, but with a different arrangement of the first switch 104, the resistor 602, and the second switch 604. In particular, the first switch 104 is electrically coupled across the input port 102, and the resistor 602 and the second switch 604 are electrically coupled in series across the input port 102 and in parallel with the first switch 104. In the first operating mode, the first switch 104 is closed and the second switch 604 is open such that current does not flow through the resistor 602. In the second operating mode, the first switch 104 is open and the second switch 604 is closed such that the resistor 602 is electrically coupled across the input port 102. In some embodiments, the first operating mode is a normal operating mode, and the second operating mode is a training mode where the first controller 112 uses the resistor 602 to determine one or more characteristics of the electrical circuit including the A/V doorbell 700.

In particular embodiments of the FIG. 6 example and the FIG. 7 example, the first power supply 106 is embodied as illustrated in FIG. 2, and the first controller 112 (a) samples a voltage $V_1$ on the DC power rail 208 in the first operating mode and (b) samples a voltage $V_2$ on the DC power rail 208 in the second operating mode. In some embodiments, step (a) is performed before step (b), and in other embodiments step (b) is performed before step (a). The first controller 112 determines an impedance of the electrical circuit, e.g., a combined impedance Z of the AC electrical power source 118 and the signaling device 120, at least partially based on voltage $V_1$ and voltage $V_2$. For example, in particular embodiments, the first controller 112 determines combined impedance Z from Equation 1 below, where R is resistance of the resistor 602:

$$Z = \frac{R(V_1 - V_2)}{V_2} \quad \text{(Equation 1)}$$

Voltage $V_1$ in the first operating mode represents approximate peak voltage of the AC electrical power source 118. For example, if the AC electrical power source 118 has a root-mean-square (RMS) voltage of 18 volts, voltage $V_1$ may be approximately equal to 25.5 volts ($\sqrt{2}$*18 volts) in the first operating mode. Voltage $V_1$ on the DC power rail 208 in the second operating mode, on the other hand, represents approximate peak voltage across the resistor 602. Consider a hypothetical scenario where (1) voltage $V_1$ in the first operating mode is 25.5 volts, (2) voltage $V_1$ in the second operating mode is 22.2 volts, and (3) the resistor 602 has a resistance of 1,000 ohms. These values can be substituted in Equation 1 above to determine that the combined impedance Z in this scenario is about 149 ohms, or, in other words, the combined impedance of the signaling device 120 and the AC electrical power source 118 is about 149 ohms, neglecting impedance of the wiring 122, in the example of FIG. 6 or FIG. 7.

In some embodiments of the FIG. 6 example and the FIG. 7 example, the first controller 112 further determines characteristics of the AC electrical power source 118 and/or the signaling device 120 from the combined impedance Z. For example, the first controller 112 may determine, in response to the combined impedance Z exceeding a predetermined threshold value, that the signaling device 120 is incorrectly connected to the wiring 122. As another example, the first controller 112 may determine that the signaling device 120 is not present, e.g., the AC electrical power source 118 is connected directly across the input port 102, in response to the combined impedance Z being below a threshold value. In some embodiments, the first controller 112 may be configured to disable closing of the switch 104 in response to the first controller 112 determining that the signaling device 120 is not present. As yet another example, the first controller 112 may determine whether the AC electrical power source 118 is present, or whether a different type of AC electrical power is present in place of the AC electrical power source 118, from a lookup table relating the combined impedance Z to electrical power source types.

Furthermore, in some embodiments of the FIG. 6 example and the FIG. 7 example, the first controller 112 determines combined impedances $Z_p$ and $Z_n$, where combined impedance $Z_p$ is combined impedance Z during a positive half cycle of the AC electrical power source 118, and combined impedance $Z_n$ is combined impedance Z during a negative half cycle of the AC electrical power source 118. In these embodiments, the first controller 112 further determines whether the impedance of the electrical circuit including the A/V doorbell 100, 600, 700 is symmetrical from a difference between the combined impedances $Z_p$ and $Z_n$. In particular, the first controller 112 may determine that the combined impedance of the electrical circuit is symmetrical if the difference between the combined impedances $Z_p$ and $Z_n$ is less than a first threshold value, and/or the first controller 112 may determine that the combined impedance of the electrical circuit is not symmetrical if the difference between the combined impedances $Z_p$ and $Z_n$ exceeds a second threshold value. A symmetrical combined impedance Z typically indicates that the signaling device 120 is a mechanical signaling device, and an asymmetrical combined impedance Z typically indicates that the signaling device 120 is an electronic signaling device. Accordingly, in some embodiments, the first controller 112 determines that the signaling device 120 is a mechanical signaling device in response to determining that the combined impedance Z is symmetric, and the first controller 112 determines that the signaling device is an electronic signaling device in response to determining that the combined impedance Z is not symmetric. In certain embodiments, the first controller 112 transmits information about the determined type (e.g., mechanical or electronic) of the signaling device to the second controller 114, and the second controller 114 uses this information to determine a duration of the activation time of the signaling device 120 (e.g., a shorter duration for a mechanical signaling device and a longer duration for an electronic signaling device). In certain embodiments, the first controller 112 transmits the combined impedance Z, the combined impedance $Z_p$, and/or the combined impedance $Z_n$ to an external device, e.g., using a communication module 1312 of FIG. 13 (discussed below), such as for remote troubleshooting of the A/V doorbell 100, 600, 700.

In some embodiments of the FIG. 6 example and the FIG. 7 example, the first controller 112 determines a voltage $V_R$ across the resistor 602, and determines a magnitude of a current $I_R$ flowing through the resistor 602 based on the voltage $V_R$, e.g., by dividing the voltage $V_R$ by the resistance of the resistor 602. In these embodiments, the first controller 112 may determine currents $I_{Rp}$ and $I_{Rn}$, where current $I_{Rp}$ is a peak absolute value of current $I_R$ during a positive half cycle of the AC electrical power source 118, and current $I_{Rn}$ is a peak absolute value of current $I_R$ during a negative half cycle of the AC electrical power source 118. The first controller 112 may determine that the impedance of the electrical circuit including the A/V doorbell 100, 600, 700 is not symmetric in response to the current $I_{Rp}$ being greater than or less than the current $I_{Rn}$ by a first threshold value. Additionally, the first controller 112 may be configured to determine that the impedance of the electrical circuit including the A/V doorbell 100, 600, 700 is symmetric in response to the current $I_{Rp}$ not being greater than or less than the current $I_{Rn}$ by more than a second threshold value. Furthermore, in some embodiments, the first controller 112 implements over-current protection by causing the switch 104 to open in response to the voltage $V_R$ or the current $I_R$ crossing, e.g., rising above, a threshold value.

Figure 8:
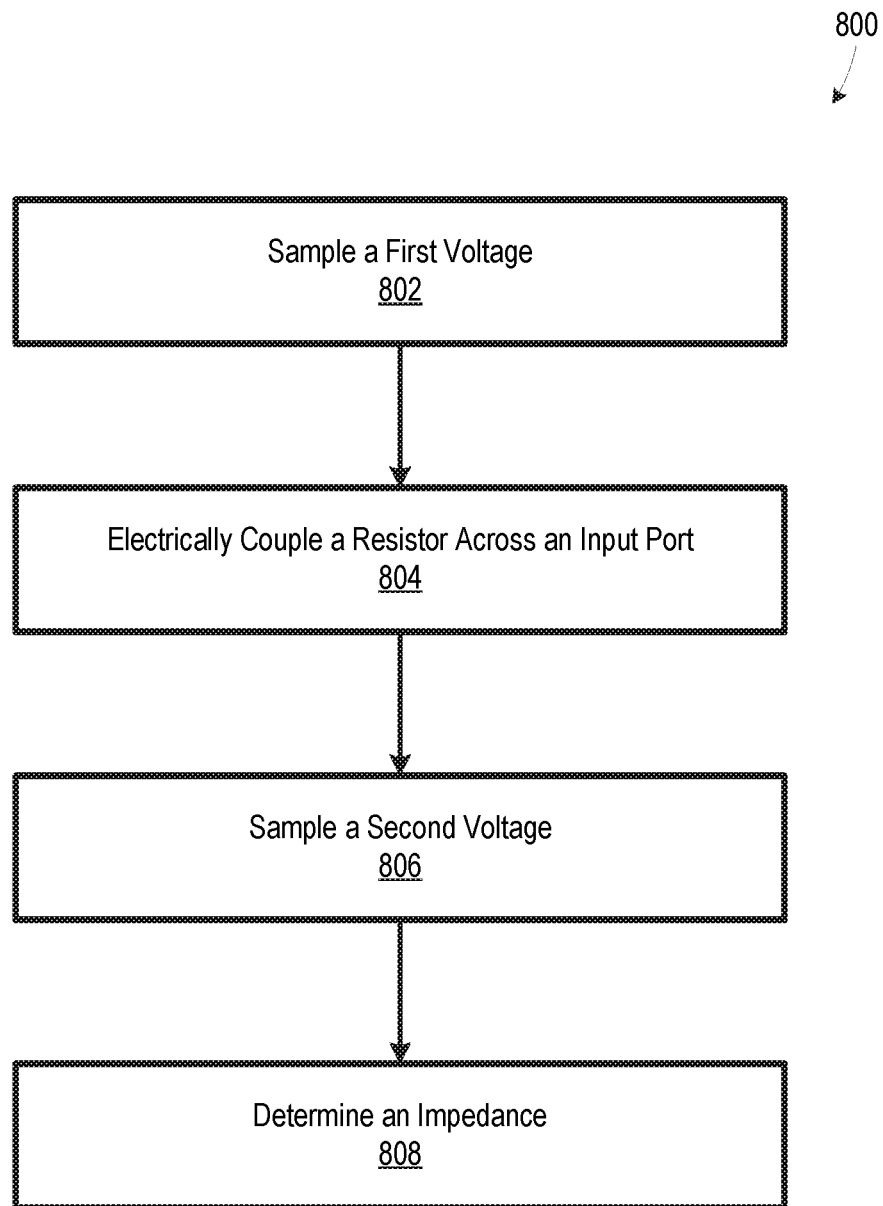
FIG. 8 is a flowchart illustrating an example process of characterizing an electrical circuit including an A/V recording and communication doorbell device, according to various aspects of the present disclosure.

FIG. 8 is a flowchart illustrating an example process 800 of characterizing an electrical circuit including an A/V doorbell, according to various aspects of the present disclosure. At block 802, a first voltage is sampled at the A/V doorbell. For example, the first controller 112 (FIG. 6 or FIG. 7) may sample the voltage $V_1$ on the DC power rail 208 (FIG. 2) in the first operating mode. At block 804, a resistor is electrically coupled across an input port of the A/V doorbell. For example, the first controller 112 in FIG. 6 may open the second switch 604 and close the first switch 104 to cause the A/V doorbell 600 to operate in its second operating mode, such that the resistor 602 is electrically coupled across the input port 102. As another example, the first controller 112 in FIG. 7 may close the second switch 604 and open the first switch 104 to cause the A/V doorbell 600 to operate in its second operating mode, such that the resistor 602 is electrically coupled across the input port 102.

At block 806, a second voltage is sampled at the A/V doorbell while the resistor is electrically coupled across the input port 102. For example, the first controller 112 may sample the voltage $V_2$ on the DC power rail 208 in the second operating mode (FIG. 6 or FIG. 7). At block 808, an impedance of the electrical circuit is determined from at least the first voltage and the second voltage. For example, the first controller 112 may determine the combined impedance Z using Equation 1 above.

Figure 9:
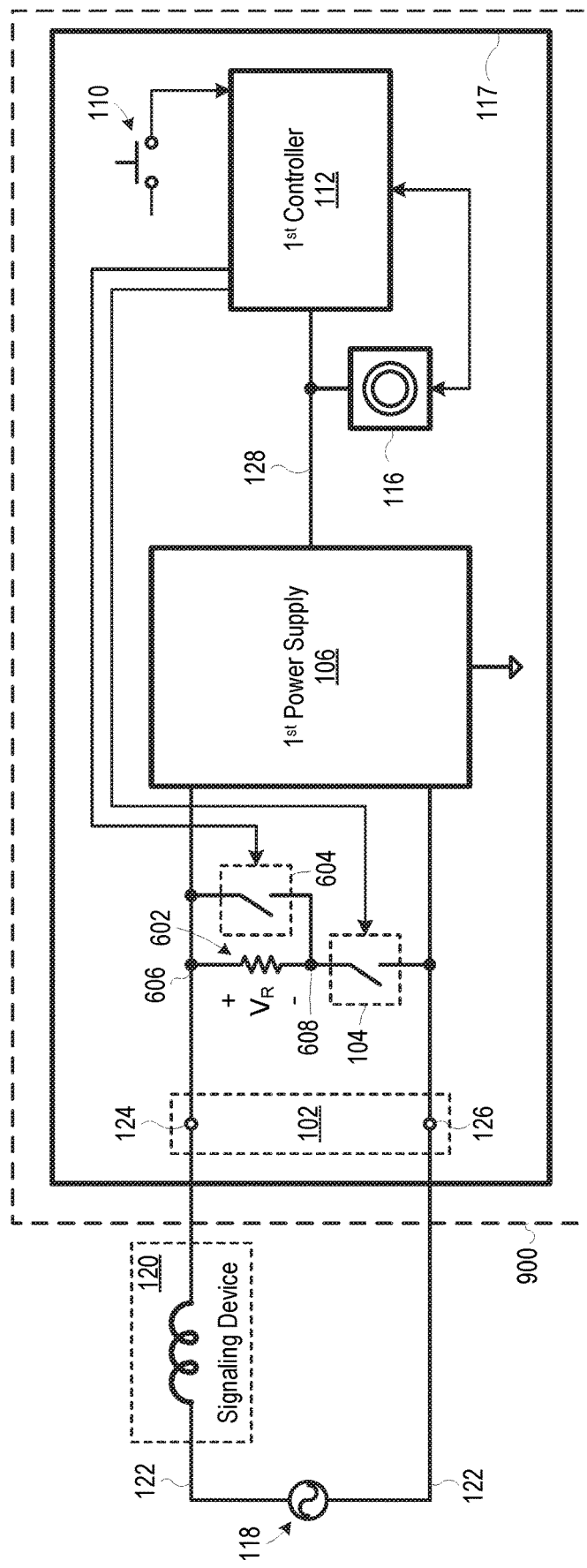
FIG. 9 is a schematic diagram of another example of an electrical circuit including an A/V recording and communication doorbell device, according to various aspects of the present disclosure.

In various embodiments, the concept of causing the switch 104 to repeatedly open and close in response to the button 110 being pressed could be applied to A/V doorbells with differing numbers of power supplies and/or controllers. For example, the concept of causing the switch 104 to repeatedly open and close in response to the button 110 being pressed could be applied to an A/V doorbell with only a single controller and only a single power supply. Additionally, the A/V doorbell 600 of FIG. 6 and the A/V doorbell 700 of FIG. 7 could be modified to have differing numbers of controllers and/or power supplies. For example, FIG. 9 is a schematic diagram of an electrical circuit including an A/V recording and communication doorbell device ("A/V doorbell") 900, according to various aspects of the present disclosure. The A/V doorbell 900 is similar to the A/V doorbell 600 of FIG. 6, but with the second controller 114 and the second power supply 108 omitted. The camera 116 is powered by the first power supply rail 128, and the camera 116 is at least partially controlled by the first controller 112, in the A/V doorbell 900.

Figure 10:
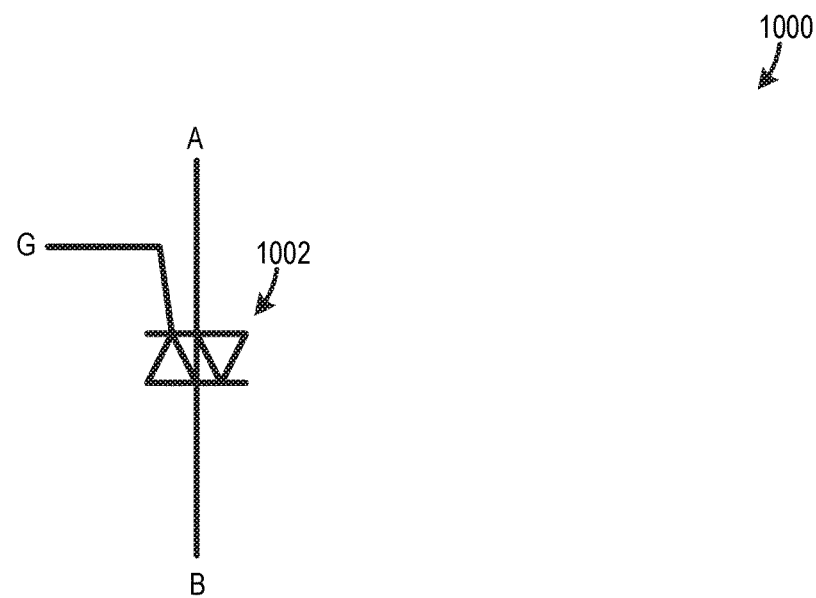
FIGS. 10 and 11 are schematic diagrams of example switches, according to various aspects of the present disclosure.

FIG. 10 is a schematic diagram of a switch 1000, which is one possible embodiment of the switch 104 (FIGS. 1, 6, 7, and 9). The switch 1000 includes a bidirectional triode thyristor 1002, including terminals A, B, and G. The terminals A and B are configured to electrically couple to the input port 102 and/or to the resistor 602. For example, in embodiments where the switch 104 of FIG. 1 or FIG. 7 is implemented by the switch 1000, the terminals A and B are electrically coupled across the input port 102. As another example, in embodiments where the switch 104 of FIG. 6 is implemented by the switch 1000, one of the terminals A and B is electrically coupled to the second node 608 of the resistor 602 and the other of the terminals A and B is electrically coupled to the second terminal 126 of the input port 102.

The first controller 112 controls the switch 1000 via the terminal G. For example, the first controller 112 may cause the bidirectional triode thyristor 1002 to operate in its on state in response to the button 110 being pressed, to activate the signaling device 120. Additionally, the first controller 112 may cause the bidirectional triode thyristor 1002 to alternate between operating in its on-state and operating in its off-state when the button 110 is pressed, such as in response to the voltage of the first power supply (e.g., the voltage on the first power supply rail 128 or the voltage on the DC power rail 208) crossing a threshold value, in a manner similar to that discussed above with respect to FIG. 5.

Figure 11:
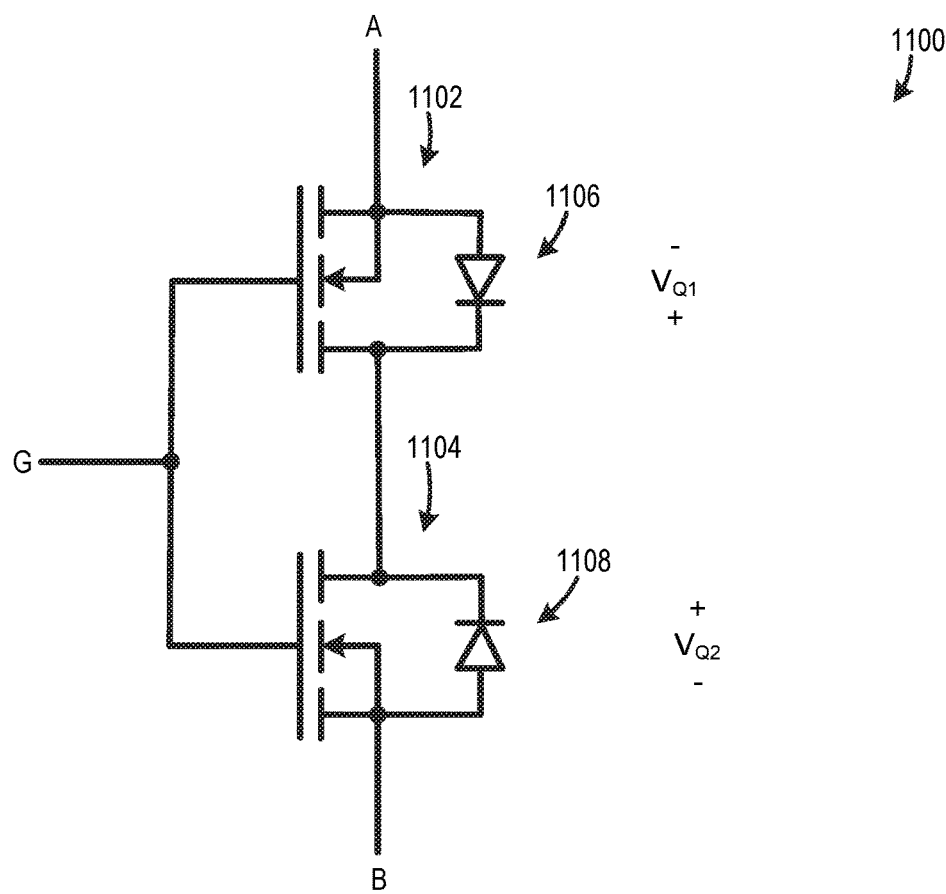

FIG. 11 is a schematic diagram of a switch 1100, which is another possible embodiment of the switch 104 (FIGS. 1, 6, 7, and 9). The switch 1100 includes a first transistor 1102 and a second transistor 1104 electrically coupled in series between terminals A and B. The transistors 1102 and 1104 are coupled such that their respective body diodes 1106 and 1108 have opposing orientations, e.g., the cathode of one of the body diodes is coupled to the cathode of the other of the body diodes, or the anode of one of the body diodes is coupled to the anode of the other of the body diodes, to prevent undesired conduction of the switch 1100. The terminals A and B are configured to electrically couple to the input port 102. For example, in embodiments where the switch 104 of FIG. 1 or FIG. 7 is implemented by the switch 1100, the terminals A and B are electrically coupled across the input port 102. As another example, in embodiments where the switch 104 of FIG. 6 is implemented by the switch 1100, one of the terminals A and B is electrically coupled to the second node 608 of the resistor 602 and the other of the terminals A and B is electrically coupled to the second terminal 126 of the input port 102. Although the transistors 1102 and 1104 are illustrated as being enhancement mode, n-channel MOSFETS, the transistors 1102 and 1104 could be other types of transistors, e.g., a depletion mode MOSFET, a p-channel MOSFET, or a BJT.

The respective gates of the transistors 1102 and 1104 are coupled to a terminal G, which is used to control the switch 1100. The first controller 112 is communicatively coupled to the terminal G to control the switch 1100. For example, the first controller 112 may cause each of the first transistor 1102 and the second transistor 1104 to operate in its respective on-state in response to the button 110 being pressed, to activate the signaling device 120. Additionally, in some embodiments, the first controller 112 causes the first transistor 1102 and the second transistor 1104 to alternate between operating in their respective on-states (e.g., simultaneously) and operating in their respective off-states (e.g., simultaneously) while the button 110 is pressed, such as in response to the voltage of the first power supply 106 crossing a threshold value, in a manner similar to that discussed above with respect to FIG. 5.

In some embodiments, the first controller 112 causes the switch 1100 to emulate a diode by causing one of the first transistor 1102 and the second transistor 1104 to continuously operate in its on-state. For example, in an embodiment, the first controller 112 causes the first transistor 1102 to continuously operate in its on-state such that the body diode 1108 of the second transistor 1104 causes the switch 1100 to emulate a diode having an anode connected to terminal B and a cathode connected to terminal A. As another example, in an embodiment, the first controller 112 causes the second transistor 1104 to continuously operate in its on-state such that the body diode 1106 of the first transistor 1102 causes the switch 1100 to emulate a diode having an anode connected to terminal A and a cathode connected to terminal B. In particular embodiments, the first controller 112 causes the switch 1100 to emulate a diode, e.g., to cause one of the first transistor 1102 and the second transistor 1104 to operate in its on-state, in response to determining that the combined impedance Z is not symmetric, e.g., as discussed above with respect to FIGS. 6 and 7. For example, in one embodiment, the first controller 112 causes the second transistor 1104 to continuously operate in its on-state in response to determining that the current $I_{Rp}$ is greater than the current $I_{Rn}$, and causes the first transistor 1102 to continuously operate in its on-state in response to determining that the current $I_{Rn}$ is greater than the current $I_{Rp}$. Determining that the combined impedance Z is not symmetric indicates that the signaling device 120 is an electronic signaling device, as discussed above. An electronic signaling device typically requires a discrete diode across a doorbell device's input port, e.g., across the input port 102. Causing the switch 1100 to emulate a diode, however, advantageously eliminates the need for such a discrete diode.

Furthermore, in some embodiments, the first controller 112 determines which of the first transistor 1102 and the second transistor 1104 continuously operates in its on-state such that the switch 1100 emulates a diode oriented in a direction that reduces the magnitude of current flowing through the diode. Such a determination of diode orientation by the first controller 112 advantageously helps ensure that the diode emulated by the switch 1100 has a proper orientation for the signaling device 120.

There will be a voltage across each of the first transistor 1102 and the second transistor 1104 when current is flowing through the transistor, due to on-resistance of the transistor. Such voltage is proportional to the magnitude of current flowing through the transistor. Accordingly, in some embodiments, the first controller 112 senses a voltage $V_{Q1}$ across the first transistor 1102 when the first transistor 1102 is operating in its on-state, and/or senses a voltage $V_{Q2}$ across the second transistor 1104 when the second transistor 1104 is operating in its on-state, to implement over-current protection in the A/V doorbell 100, 600, 700, 900. In some embodiments, the first controller 112 causes the first transistor 1102 and/or the second transistor 1104 to operate in its off-state in response to the voltage $V_{Q1}$ crossing (e.g., rising above) a threshold value, to implement over-current protection. Additionally, in some embodiments, the first controller 112 causes the first transistor 1102 and/or the second transistor 1104 to operate in its off-state in response to the voltage $V_{Q2}$ crossing (e.g., rising above) a threshold value, to implement over-current protection. Additionally, in some embodiments, the first controller 112 senses a voltage across the switch 1100, e.g., between terminals A and B, when the switch 1100 is operating in its on-state, and the first controller 112 causes the first transistor 1102 and/or the second transistor 1104 to operate in its off-state in response to the voltage across the switch crossing (e.g., rising above) a threshold value. Furthermore, in some embodiments where the switch 104 of the A/V doorbell 600, 700, 900 is implemented by the switch 1100, the first controller 112 compares the magnitude of current flowing through the resistor 602 to a threshold value, and causes each of the first transistor 1102 and the second transistor 1104 to operate in its respective off-state in response to the magnitude of current flowing through the resistor 602 crossing (e.g., rising above) the threshold value.

Figure 12:
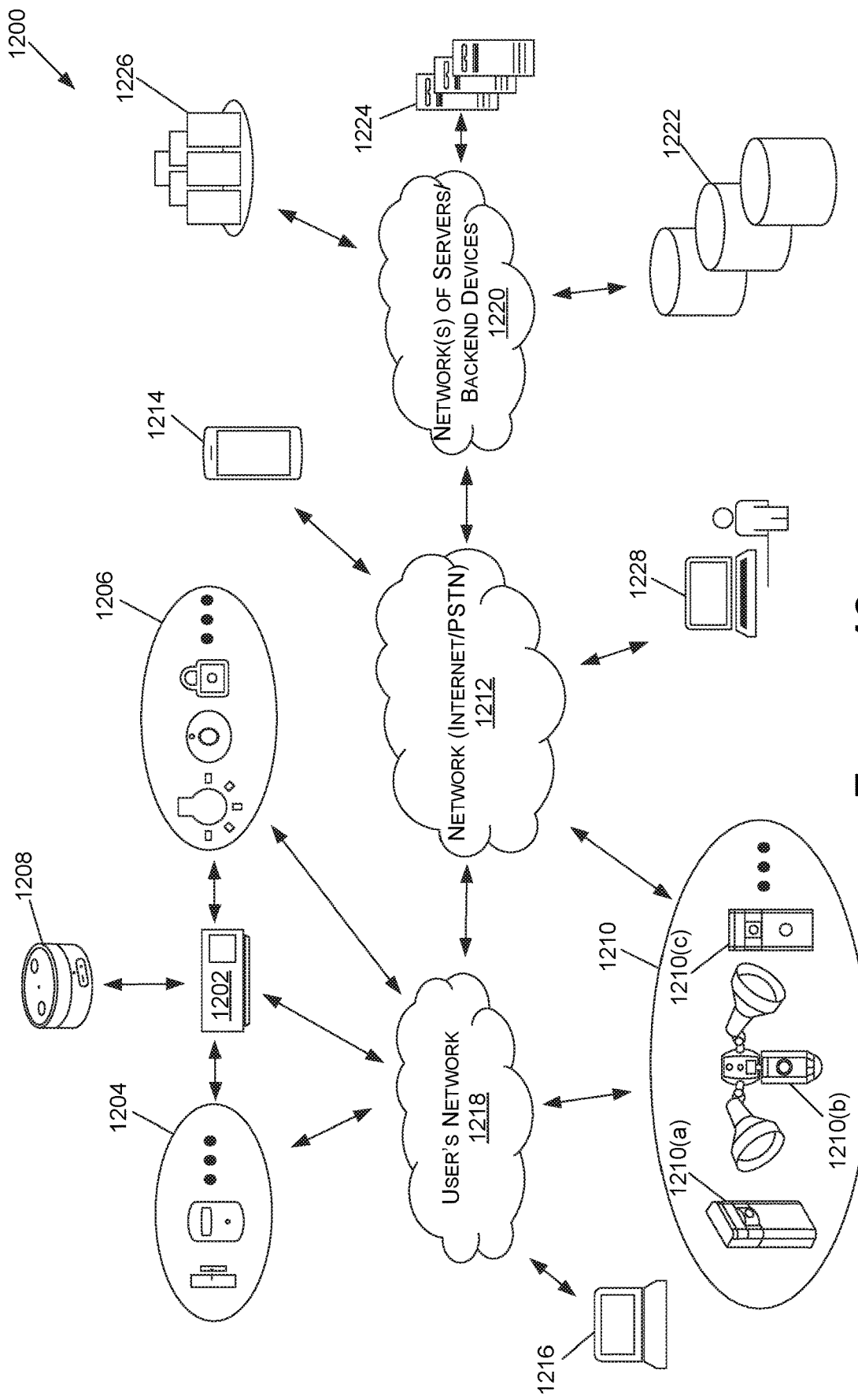
FIG. 12 is a functional block diagram illustrating a system for communicating in a network according to various aspects of the present disclosure.

FIG. 12 is a functional block diagram illustrating a system 1200 for communicating in a network according to various aspects of the present disclosure. Home automation, or smart home, is building automation for the home. Home automation enable users (e.g., home owners and authorized individuals) to control and/or automate various devices and/or systems, such as lighting, heating (e.g., smart thermostats), ventilation, home entertainment, air conditioning (HVAC), blinds/shades, security devices (e.g., contact sensors, smoke/CO detectors, motion sensors, etc.), washers/dryers, ovens, refrigerators/freezers, and/or other network connected devices suitable for use in the home. In various embodiments, Wi-Fi is used for remote monitoring and control of such devices and/or systems. Smart home devices (e.g., hub devices 1202, sensors 1204, automation devices 1206, a virtual assistant (VA) device 1208, Audio/Video (A/V) recording and communication devices 1210, etc.), when remotely monitored and controlled via a network (Internet/a public switched telephone network (PSTN)) 1212 (which may be similar to, and represent the network 1212), may be considered to be components of the "Internet of Things." Smart home systems may include switches and/or sensors (e.g., the sensors 1204) connected to a central hub such as the smart-home hub device 1202 and/or the VA device 1208 (the hub device 1202 and/or the VA device 1208 may alternatively be referred to as a gateway, a controller, a home-automation hub, or an intelligent personal assistance device) from which the system may be controlled through various user interfaces, such as voice commands and/or a touchscreen. Various examples, of user interfaces may include any or all of a wall-mounted terminal (e.g., a keypad, a touchscreen, etc.), software installed on the client devices 1214, 1216 (e.g., a mobile application), a tablet computer, or a web interface. Furthermore, these user interfaces are often but not always supported by Internet cloud services. In one example, the Internet cloud services are responsible for obtaining user input via the user interfaces (e.g., a user interface of the hub device 1202 and/or the VA device 1208) and causing the smart home devices (e.g., the sensors 1204, the automation devices 1206, etc.) to perform an operation in response to the user input.

The hub device 1202, the VA device 1208, the sensors 1204, the automation devices 1206, the A/V recording and communication devices 1210, and/or client devices 1214, 1216 may use one or more wired and/or wireless communication protocols to communicate, including, for example and without limitation, Wi-Fi (e.g., the user's network 1218), X10, Ethernet, RS-485, 6LoWPAN, Bluetooth LE (BLE), ZigBee, Z-Wave, and/or a low power wide-area networks (LPWAN), such as a chirp spread spectrum (CSS) modulation technology network (e.g., LoRaWAN), an Ultra Narrow Band modulation technology network (e.g., Sigfox, Telensa, NB-IoT, etc.), RingNet, and/or the like.

The user's network 1218 may be, for example, a wired and/or wireless network. If the user's network 1218 is wireless, or includes a wireless component, the user's network 1218 may be a Wi-Fi network compatible with the IEEE 802.11 standard and/or other wireless communication standard(s). Furthermore, the user's network 1218 may be connected to other networks such as the network 1212, which may comprise, for example, the Internet and/or PSTN.

The system 1200 may include one or more A/V recording and communication devices 1210 (alternatively be referred to herein as "A/V devices 1210" or "A/V device 1210") (which may represent, and/or be similar to, the A/V recording and communication doorbell devices 100, 600, 700, and/or 900 of FIGS. 1, 6, 7, and 9, respectively). The A/V devices 1210 may include security cameras 1210(a), light cameras 1210(b) (e.g., floodlight cameras, spotlight cameras, etc.), video doorbells 1210(c) (e.g., wall powered and/or battery powered video doorbells), and/or other devices capable of recording audio data and/or image data. The A/V devices 1210 may be configured to access a user's network 1218 to connect to a network (Internet/PSTN) 1212 and/or may be configured to access a cellular network to connect to the network (Internet/PSTN) 1212. The components and functionality of one embodiment of the A/V devices 1210 are described in more detail below with respect to FIG. 13.

The system 1200 may further include a smart-home hub device 1202 (which may alternatively be referred to herein as the "hub device 1202") connected to the user's network 1218 and/or the network (Internet/PSTN) 1212. The smart-home hub device 1202 (also known as a home automation hub, gateway device, or network device), may comprise any device that facilitates communication with and control of the sensors 1204, automation devices 1206, the VA device 1208, and/or the one or more A/V devices 1210. For example, the smart-home hub device 1202 may be a component of a security system and/or a home automation system installed at a location (e.g., a property, a premise, a home, a business, etc.). In some embodiments, the A/V devices 1210, the VA device 1208, the sensors 1204, and/or the automation devices 1206 communicate with the smart-home hub device 1202 directly and/or indirectly using one or more wireless and/or wired communication protocols (e.g., BLE, Zigbee, Z-Wave, etc.), the user's network 1218 (e.g., Wi-Fi, Ethernet, etc.), and/or the network (Internet/PSTN) 1212. In some of the present embodiments, the A/V devices 1210, the VA device 1208, the sensors 1204, and/or the automation devices 1206 may, in addition to or in lieu of communicating with the smart-home hub device 1202, communicate with the client devices 1214, 1216, the VA device 1208, and/or one or more of components of the network of servers/backend devices 1220 directly and/or indirectly via the user's network 1218 and/or the network (Internet/PSTN) 1212.

As illustrated in FIG. 12, the system 1200 includes the VA device 1208. The VA device 1208 may be connected to the user's network 1218 and/or the network (Internet/PSTN) 1212. The VA device 1208 may include an intelligent personal assistant, such as, without limitation, Amazon Alexa® and/or Apple Siri®. For example, the VA device 1208 may be configured to receive voice commands, process the voice commands to determine one or more actions and/or responses (e.g., transmit the voice commands to the one or more components of the network of servers/backend devices 1220 for processing), and perform the one or more actions and/or responses, such as to activate and/or change the status of one or more of the sensors 1204, automation devices 1206, or A/V devices 1210. In some embodiments, the VA device 1208 is configured to process user inputs (e.g., voice commands) without transmitting information to the network of servers/backend devices 1220 for processing. The VA device 1208 may include at least one speaker (e.g., for playing music, for outputting the audio data generated by the A/V devices 1210, for outputting the voice of a digital assistant, etc.), at least one a microphone (e.g., for receiving commands, for recording audio data, etc.), and a display (e.g., for displaying a user interface, for displaying the image data generated by the A/V devices 1210, etc.). In various embodiments, the VA device 1208 may include an array of speakers that are able to produce beams of sound. Although illustrated as a separate component in FIG. 12, in some embodiments the VA device 1208 may not be a separate component from the hub device 1202. In such embodiments, the hub device 1202 may include at least some of the functionality of the VA device 1208 or the VA device 1208 may include at least some of the functionality of the hub device 1202.

The one or more sensors 1204 may include, for example, at least one of a door sensor, a window sensor, a contact sensor, a tilt sensor, a temperature sensor, a carbon monoxide sensor, a smoke detector, a light sensor, a glass break sensor, a freeze sensor, a flood sensor, a moisture sensor, a motion sensor, and/or other sensors that may provide the user/owner of the security system a notification of a security event at his or her property.

In various embodiments, a contact sensor may include any component configured to inform (e.g., via a signal) the security system whether an object (e.g., a door or a window) is open or closed. A contact sensor may include first and second components: a first component installed on the object itself (e.g., the door or the window); the second component installed next to the object (e.g., on the door jamb). The first and second components of the contact sensor, however, need not actually be in physical contact with one another in order to be in the closed (not faulted) state. For example, at least one of the first and second components may include a magnet, and the contact sensor may rely on the Hall effect for determining a proximity of the first and second pieces to one another. When the door, window, or other object, is opened, and the first and second components move apart from one another, the contact sensor may transmit an open signal to the security system (e.g., to the hub device 1202). A similar process may be performed when the object is closed. In some examples, a signal transmitted by the security system by the contact sensor during opening and/or closing may be the same signal, and the hub device 1202 may interpret the signal based on the known state of the object (e.g., when a door is closed, and the signal is received, the hub device 1202 may update the status of the door to open).

The one or more automation devices 1206 may include, for example, at least one of an outdoor lighting system, an indoor lighting system, and indoor/outdoor lighting system, a temperature control system (e.g., a thermostat), a shade/blind control system, a locking control system (e.g., door lock, window lock, etc.), a home entertainment automation system (e.g., TV control, sound system control, etc.), an irrigation control system, a wireless signal range extender (e.g., a Wi-Fi range extender, a Z-Wave range extender, etc.) a doorbell signaling device, a barrier control device (e.g., an automated door hinge), a smart doormat, and/or other automation devices.

As described herein, in some of the present embodiments, some or all of the client devices 1214, 1216, the A/V device(s) 1210, the smart-home hub device 1202, the VA device 1208, the sensors 1204, and the automation devices 1206 may be referred to as a security system and/or a home-automation system. The security system and/or home-automation system may be installed at location, such as a property, home, business, or premises for the purpose of securing and/or automating all or a portion of the location.

The system 1200 may further include one or more client devices 1214, 1216. The client devices 1214, 1216 may communicate with and/or be associated with (e.g., capable of access to and control of) the A/V devices 1210, a smart-home hub device 1202, the VA device 1208, sensors 1204, and/or automation devices 1206. In various embodiments, the client devices 1214, 1216 communicate with other devices using one or more wireless and/or wired communication protocols, the user's network, and/or the network (Internet/PSTN) 1212, as described herein. The client devices 1214, 1216 may comprise, for example, a mobile device such as a smartphone or a personal digital assistant (PDA), or a computing device such as a tablet computer, a laptop computer, a desktop computer, etc. In some embodiments, the client devices 1214, 1216 include a connected device, such as a smart watch, Bluetooth headphones, another wearable device, or the like. In such embodiments, the client devices 1214, 1216 may include a combination of the smartphone or other device and a connected device (e.g., a wearable device), such that alerts, data, and/or information received by the smartphone or other device are provided to the connected device, and one or more controls of the smartphone or other device may be input using the connected device (e.g., by touch, voice, etc.).

The A/V devices 1210, the hub device 1202, the VA device 1208, the automation devices 1206, the sensors 1204, and/or the client devices 1214, 1216 may also communicate, via the user's network 1218 and/or the network (Internet/PSTN) 1212, with network(s) of servers and/or backend devices 1220, such as (but not limited to) one or more remote storage devices 1222 (may be referred to interchangeably as "cloud storage device(s)"), one or more backend servers 1224, and one or more backend application programming interfaces (APIs) 1226. While FIG. 12 illustrates the storage device 1222, the backend server 1224, and the backend API 1226 as components separate from the network 1220, it is to be understood that the storage device 1222, the backend server 1224, and/or the backend API 1226 may be considered to be components of the network 1220. For example, the network 1220 may include a data center with a plurality of computing resources used to implement the storage device 1222, the backend server 1224, and the backend API 1226.

The backend server 1224 may comprise a computer program or other computer executable code that, when executed by processor(s) of the backend server 1224, causes the backend server 1224 to wait for requests from other computer systems or software (clients) and provide responses. In an embodiment, the backend server 1224 shares data and/or hardware and/or software resources among the client devices 1214, 1216. This architecture is called the client-server model. The client devices 1214, 1216 may run on the same computer or may connect to the backend server 1224 over the network (Internet/PSTN) 1212 and/or the network 1220. Examples of computing servers include database servers, file servers, mail servers, print servers, web servers, game servers, and application servers. The term server may be construed broadly to include any computerized process that shares a resource to one or more client processes.

The backend API 1226 may comprise, for example, a server (e.g. a real server, or a virtual machine, or a machine running in a cloud infrastructure as a service), or multiple servers networked together, exposing at least one API to clients. In various embodiments, the backend API 1226 is provided by servers including various components such as an application server (e.g. software servers), a caching layer, a database layer, or other components suitable for implementing one or more APIs. The backend API 1226 may, for example, comprise a plurality of applications, each of which communicate with one another using one or more public APIs. In some embodiments, the backend API 1226 maintains user data and provides user management capabilities, thereby reducing the load (e.g., memory and processor consumption) of the client devices 1214, 1216.

In various embodiments, an API is a set of routines, protocols, and tools for building software and applications.

Furthermore, the API may describe a software component in terms of its operations, inputs, outputs, and underlying types, defining functionalities that are independent of their respective implementations, which allows definitions and implementations to vary without compromising the interface. As such, the API may provide a programmer with access to a particular application's functionality without the need to modify the particular application.

The backend API 1226 illustrated in FIG. 12 may further include one or more services (also referred to as network services). A network service is an application that provides data storage, manipulation, presentation, communication, and/or other capability. Network services are often implemented using a client-server architecture based on application-layer network protocols. Each service may be provided by a server component (e.g., the backend server 1224) running on one or more computers (such as a dedicated server computer offering multiple services) and accessed via a network by client components running on other devices (e.g., client devices 1214, 1216). However, the client and server components can both be run on the same machine. Clients and servers may have a user interface, and sometimes other hardware associated with them.

The network 1220 may be any wireless network, any wired network, or a combination thereof, configured to operatively couple the above-mentioned modules, devices, components, and/or systems as illustrated in FIG. 12. For example, the network 1220, the user's network 1218, and/or the network (Internet PSTN) 1212 may include one or more of the following: a PSTN (public switched telephone network), the Internet, a local intranet, a PAN (Personal Area Network), a LAN (Local Area Network), a WAN (Wide Area Network), a MAN (Metropolitan Area Network), a virtual private network (VPN), a storage area network (SAN), a frame relay connection, an Advanced Intelligent Network (AIN) connection, a synchronous optical network (SONET) connection, a digital T1, T3, E1 or E3 line, a Digital Data Service (DDS) connection, a DSL (Digital Subscriber Line) connection, an Ethernet connection, an ISDN (Integrated Services Digital Network) line, a dial-up port such as a V.90, V.34, or V.34bis analog modem connection, a cable modem, an ATM (Asynchronous Transfer Mode) connection, or an FDDI (Fiber Distributed Data Interface) or CDDI (Copper Distributed Data Interface) connection. Furthermore, communications may also include links to any of a variety of wireless networks, including WAP (Wireless Application Protocol), GPRS (General Packet Radio Service), GSM (Global System for Mobile Communication), LTE, VoLTE, LoRaWAN, LPWAN, RPMA, LTE Cat-"X" (e.g. LTE Cat 1, LTE Cat 0, LTE CatM1, LTE Cat NB1), CDMA (Code Division Multiple Access), TDMA (Time Division Multiple Access), FDMA (Frequency Division Multiple Access), and/or OFDMA (Orthogonal Frequency Division Multiple Access) cellular phone networks, global navigation satellite system (GNSS), such as global positioning systems (GPS), CDPD (cellular digital packet data), RIM (Research in Motion, Limited) duplex paging network, Bluetooth radio, or an IEEE 802.11-based radio frequency network. The network can further include or interface with any one or more of the following: RS-232 serial connection, IEEE-4024 (Firewire) connection, Fibre Channel connection, IrDA (infrared) port, SCSI (Small Computer Systems Interface) connection, USB (Universal Serial Bus) connection, or other wired or wireless, digital or analog, interface or connection, mesh or Digi® networking.

The hub device 1202, the VA device 1208, and/or any of the components of the network(s) of servers/backend devices 1220 (e.g., the backend server 1224, the backend API 1226, the storage devices 1222, etc.) may be referred to herein as a "network device" or "network devices."

With further reference to FIG. 12, the system 1200 may also include a security monitoring service 1228. The security monitoring service 1228 may be operated by the same company that manufactures, sells, and/or distributes the A/V devices 1210, the hub device 1202, the VA device 1208, the sensors 1204, and/or the automation devices 1206. In other embodiments, the security monitoring service 1228 may be operated by a third-party company (e.g., a different company than the one that manufactured, sold, and/or distributed the A/V devices 1210, the hub device 1202, the VA device 1208, the sensors 1204, and/or the automation devices 1206). In any of the present embodiments, the security monitoring service 1228 may have control of at least some of the features and components of the security system and/or the home-automation system (e.g., the security monitoring service 1228 may be able to arm and/or disarm the security system, lock and/or unlock doors, activate and/or deactivate one or more of the sensors 1204 and/or the automation devices 1206, etc.). For example, the security monitoring service 1228 may operate and control their own client devices and/or network of servers/backend devices for monitoring and/or controlling security systems. In such an example, the A/V devices 1210, the hub device 1202, the VA device 1208, the sensors 1204, and/or the automation devices 1206 may communicate with the client devices and/or one or more components of the network of servers/backend devices of the security monitoring service 1228 over the network (Internet/PSTN) 1212 (in some embodiments, via one or more of the components of the network of backend servers/backend devices 1220).

Figure 13:
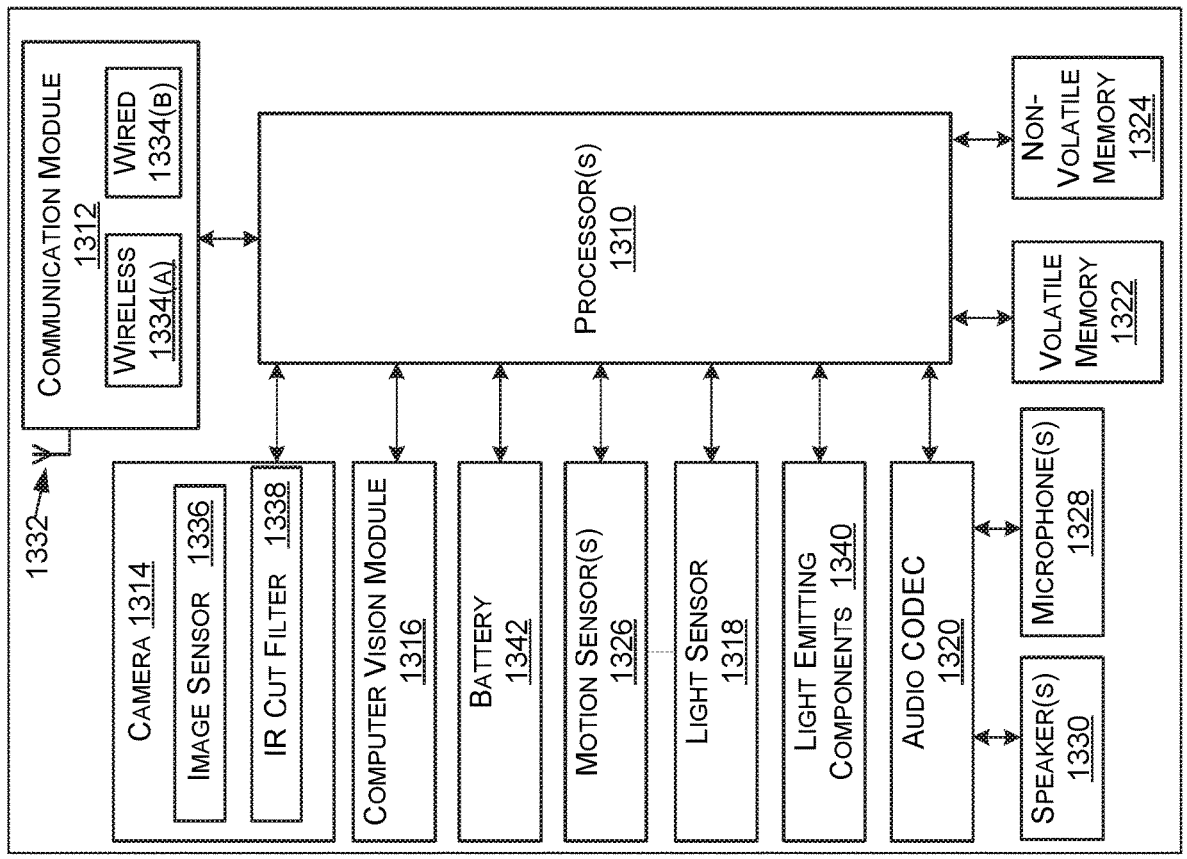
FIG. 13 is a functional block diagram of a portion of an A/V recording and communication device according to various aspects of the present disclosure.

FIG. 13 is a functional block diagram for an audio/video (A/V) device according to various aspects of the present disclosure. The embodiment of FIG. 13 is an example of one possible implementation of A/V portions of the A/V recording and communication doorbell devices 100, 600, 700, and/or 900. Accordingly, the FIG. 13 block diagram does not show the input port 102, the switch 104, the first power supply 106, the first controller 112, and the button 110 of the A/V recording and communication doorbell devices 100, 600, 700, and/or 900.

With further reference to FIG. 13, the A/V device may include a processor(s) 1310, a communication module 1312, a camera 1314, a computer vision module 1316, a light sensor 1318, an audio CODEC (coder-decoder) 1320, volatile memory 1322, and non-volatile memory 1324. The processor(s) 1310 (alternatively referred to herein as a "CPU," a "controller," and/or a "microcontroller") may comprise an integrated circuit including a processor core, memory, and programmable input/output peripherals. The processor(s) 1310 may receive input signals, such as data and/or power, from the camera 1314, motion sensor(s) 1326, light sensor 1318, microphone(s) 1328, speaker(s) 1330, and/or the communication module 1312, and may perform various functions as described in the present disclosure. In various embodiments, when the processor(s) 1310 is triggered by the motion sensor(s) 1326, the camera 1314, the speaker(s) 1330, the microphone(s) 1328, the communication module 1312, and/or another component, the processor(s) 1310 performs one or more processes and/or functions. For example, when the light sensor 1318 detects a low level of ambient light, the light sensor 1318 may trigger the processor(s) 1310 to enable a night vision camera mode. The processor(s) 1310 may also provide data communication between various components such as between the communication module 1312 and the camera 1314.

With further reference to FIG. 13, the communication module 1312 may comprise an integrated circuit including a processor core, memory, and programmable input/output peripherals. The communication module 1312 may be operatively connected to the processor(s) 1310. In some embodiments, the communication module 1312 is configured to handle communication links between the A/V device and other, external devices, external receivers, external transmitters, and/or external transceivers, and to route incoming/outgoing data appropriately. For example, inbound data from an antenna 1332 of the communication module 1312 may be routed through the communication module 1312 before being directed to the processor(s) 1310, and outbound data from the processor(s) 1310 may be routed through the communication module 1312 before being directed to the antenna 1332 of the communication module 1312. As another example, the communication module 1312 may be configured to transmit data to and/or receive data from a remote network device (e.g., one or more components of the network(s) of servers/backend devices 1220 described in FIG. 12). The communication module 1312 may include wireless 1334(*a*) and wired 1334(*b*) adapters. For example, the communication module 1312 may include one or more wireless antennas, radios, receivers, transmitters, and/or transceivers (not shown in FIG. 13 for simplicity) configured to enable communication across one or more wireless networks, such as, without limitation, Wi-Fi, cellular, Bluetooth, Z-Wave, Zigbee, LPWAN(s), and/or satellite networks. The communication module 1312 may receive inputs, such as power and/or data, from the camera 1314, the processor(s) 1310, the motion sensors 1326, a reset button (not shown in FIG. 13 for simplicity), and/or the non-volatile memory 1324. The communication module 1312 may also include the capability of communicating over wired connections.

With further reference to FIG. 13, the A/V device may include the non-volatile memory 1324 and the volatile memory 1322. The non-volatile memory 1324 may comprise flash memory configured to store and/or transmit data. For example, in certain embodiments the non-volatile memory 1324 may comprise serial peripheral interface (SPI) flash memory. In some embodiments, the non-volatile memory 1324 may comprise, for example, NAND or NOR flash memory. The volatile memory 1322 may comprise, for example, DDR3 SDRAM (double data rate type three synchronous dynamic random-access memory). In the embodiment illustrated in FIG. 13, the volatile memory 1322 and the non-volatile memory 1324 are illustrated as being separate from the processor(s) 1310. However, the illustration of FIG. 13 is not intended to be limiting, and in some embodiments the volatile memory 1322 and/or the non-volatile memory 1324 may be physically incorporated with the processor(s) 1310, such as on the same chip. The volatile memory 1322 and/or the non-volatile memory 1324, regardless of their physical location, may be shared by one or more other components (in addition to the processor(s) 1310) of the present A/V device.

With further reference to FIG. 13, the A/V device may include the camera 1314, which, for example, is an embodiment of the camera 116 of FIGS. 1, 6, 7, and 9. The camera 1314 may include an image sensor 1336. The image sensor 1336 may include a video recording sensor and/or a camera chip. In one aspect of the present disclosure, the imager sensor 1336 may comprise a complementary metal-oxide semiconductor (CMOS) array and may be capable of recording high definition (e.g., 722*p*, 1800*p*, 4K, etc.) video files. The camera 1314 may include a separate camera processor (not shown in FIG. 13 for simplicity), or the processor(s) 1310 may perform the camera processing functionality. The processor(s) 1310 (and/or camera processor) may include an encoding and compression chip. In some embodiments, the processor(s) 1310 (and/or the camera processor) may comprise a bridge processor. The processor(s) 1310 (and/or the camera processor) may process video recorded by the image sensor 1336 and/or audio recorded by the microphone(s) 1328, and may transform this data into a form suitable for transfer by the communication module 1312 to the network (Internet/PSTN) 1212. In various embodiments, the camera 1314 also includes memory, such as volatile memory that may be used when data is being buffered or encoded by the processor(s) 1310 (and/or the camera processor). For example, in certain embodiments the camera memory may comprise synchronous dynamic random-access memory (SD RAM).

The camera 1314 may further include an IR cut filter 1338 that may comprise a system that, when triggered, configures the image sensor 1336 to see primarily infrared light as opposed to visible light. For example, when the light sensor 1318 detects a low level of ambient light (which may comprise a level that impedes the performance of the image sensor 1336 in the visible spectrum), light emitting components (not shown) may shine infrared light through an enclosure of the A/V device out to the environment, and the IR cut filter 1338 may enable the image sensor 1336 to see this infrared light as it is reflected or refracted off of objects within the field of view of the doorbell. This process may provide the A/V device with the "night vision" function mentioned above.

With further reference to FIG. 13, the recording and communication A/V device may comprise the light sensor 1318 and the one or more light-emitting components 1340, such as LED's. The light sensor 1318 may be one or more sensors capable of detecting the level of ambient light of the surrounding environment in which the A/V device may be located. The light-emitting components 1340 may be one or more light-emitting diodes capable of producing visible light when supplied with power (e.g., to enable night vision). In some embodiments, when activated, the light-emitting components 1240 illuminates a light pipe.

The A/V device may further include one or more speaker(s) 1330 and/or one or more microphone(s) 1328. The speaker(s) 1330 may be any electromechanical device capable of producing sound in response to an electrical signal input. The microphone(s) 1328 may be an acoustic-to-electric transducer or sensor capable of converting sound waves into an electrical signal. In some embodiments, the A/V device may include two or more microphone(s) 1328 that are spaced from one another (e.g., located on different sides of the A/V device) to provide noise cancelling and/or echo cancelling for clearer audio. The speaker(s) 1330 and/or microphone(s) 1328 may be coupled to an audio CODEC 1320 to enable digital audio received by client devices to be decompressed and output by the speaker(s) 1330 and/or to enable audio data captured by the microphone(s) 1328 to be compressed into digital audio data. The digital audio data may be received from and transmitted to client devices using the communication module 1312 (in some embodiments, through one or more intermediary devices such as the hub device 1202, the VA device 1208, and/or one or more components of the network of servers/backend devices 1220 as described in FIG. 12). For example, when a visitor (or intruder) who is present in the area about the A/V device speaks, sound from the visitor (or intruder) is received by the microphone(s) 1328 and compressed by the audio CODEC 1320. Digital audio data is then sent through the communication module 1312 to the network 1212 via the user's network 1218, routed by the backend server 1224 and/or the backend API 1226 and delivered to the client device(s) 1214, 1216 as described above in connection with FIG. 12. When the user speaks, after being transferred through the network 1212, the user's network 1218, and the communication module 1312, the digital audio data from the user is decompressed by the audio CODEC 1320 and emitted to the visitor through the speaker(s) 1330.

With further reference to FIG. 13, the A/V device may be battery powered using a battery 1342 and/or may be powered using a source of external AC (alternating-current) power, such as a household AC power supply (alternatively referred to herein as "AC mains" or "wall power"). Battery 1342 is, for example, an embodiment of the second power supply 108 of FIGS. 1, 6, and 7. The AC power may have a voltage in the range of 110-220 VAC, for example. The incoming AC power may be received by an AC/DC adapter (not shown), which may convert the incoming AC power to DC (direct-current) and may step down the voltage from 110-220 VAC to a lower output voltage of about 12 VDC and an output current of about 2 A, for example. In various embodiments, the output of the AC/DC adapter is in a range from about 9 V to about 15 V and in a range from about 0.5 A to about 5 A. These voltages and currents are examples provided for illustration and are not intended to be limiting.

However, in other embodiments, a battery 1342 may not be included. In embodiments that include the battery 1342, the A/V device may include an integrated circuit (not shown) capable of arbitrating between multiple voltage rails, thereby selecting the source of power for the A/V device. The A/V device may have separate power rails dedicated to the battery 1342 and the AC power source. In one aspect of the present disclosure, the A/V device may continuously draw power from the battery 1342 to power the A/V device, while at the same time routing the AC power to the battery, thereby allowing the battery 1342 to maintain a substantially constant level of charge. Alternatively, the A/V device may continuously draw power from the AC power to power the doorbell, while only drawing from the battery 1342 when the AC power is low or insufficient. In such embodiments, the components of the A/V device (e.g., spring contacts, connectors, etc.) are not be connected to a source of AC power. When the battery 1342 is depleted of its charge, it may be recharged, such as by connecting a power source to the battery 1342 (e.g., using a USB connector).

Although not illustrated in FIG. 13, in some embodiments, the A/V device may include one or more of an accelerometer, a barometer, a humidity sensor, and a temperature sensor. The accelerometer may be one or more sensors capable of sensing motion and/or acceleration. The one or more of the accelerometer, the barometer, the humidity sensor, and the temperature sensor may be located outside of a housing of the A/V device so as to reduce interference from heat, pressure, moisture, and/or other stimuli generated by the internal components of the A/V device.

With further reference to FIG. 13, the A/V device may include one or more motion sensor(s) 1326. However, in some embodiments, the motion sensor(s) 1326 may not be included, such as where motion detection is performed by the camera 1314 or another device. The motion sensor(s) 1326 may be any type of sensor capable of detecting and communicating the presence of an entity within their field of view. As such, the motion sensor(s) 1326 may include one or more (alone or in combination) different types of motion sensors. For example, in some embodiments, the motion sensor(s) 1326 may comprise passive infrared (PIR) sensors, which may be secured on or within a PIR sensor holder that may reside behind a lens (e.g., a Fresnel lens). In such an example, the PIR sensors may detect IR radiation in a field of view, and produce an output signal (typically a voltage) that changes as the amount of IR radiation in the field of view changes. The amount of voltage in the output signal may be compared, by the processor(s) 1310, for example, to one or more threshold voltage values to determine if the amount of voltage in the output signal is indicative of motion, and/or if the amount of voltage in the output signal is indicative of motion of an entity that is to be captured by the camera 1314 (e.g., motion of a person and/or animal may prompt activation of the camera 1314, while motion of a vehicle may not). Although the above discussion of the motion sensor(s) 1326 primarily relates to PIR sensors, depending on the embodiment, the motion sensor(s) 1326 may include additional and/or alternate sensor types that produce output signals including alternative data types. For example, and without limitation, the output signal may include an amount of voltage change based on the presence of infrared radiation in a field of view of an active infrared (AIR) sensor, the output signal may include phase shift data from a microwave-type motion sensor, the output signal may include doppler shift data from an ultrasonic-type motion sensor, the output signal may include radio wave disturbance from a tomographic-type motion sensor, and/or the output signal may include other data types for other sensor types that may be used as the motion sensor(s) 1326 of the A/V device.

In some embodiments, computer vision module(s) (CVM) 1316 may be included in the A/V device as the motion sensor(s) 1326, in addition to, or alternatively from, other motion sensor(s) 1326. For example, the CVM 1316 may be a low-power CVM (e.g., Qualcomm Glance) that, by operating at low power (e.g., less than 2 mW of end-to-end power), is capable of providing computer vision capabilities and functionality for battery powered devices (e.g., the A/V device when powered by the battery 1342). The low-power CVM may include a lens, a CMOS image sensor, and a digital processor that may perform embedded processing within the low-power CVM itself, such that the low-power CVM may output post-processed computer vision metadata to the processor(s) 1310 (e.g., via a serial peripheral bus interface (SPI)). As such, the low-power CVM may be considered to be one or more of the motion sensor(s) 1326, and the data type output in the output signal may be the post-processed computer vision metadata. The metadata may include information such as the presence of a particular type of entity (e.g., person, animal, vehicle, parcel, etc.), a direction of movement of the entity, a distance of the entity from the A/V device, etc. In various embodiments, the motion sensor(s) 1326 include a plurality of different sensor types capable of detecting motion such as PIR, AIR, low-power CVM, and/or cameras.

As indicated above, the A/V device may include the CVM 1316 (which may be the same as the above described low-power CVM 1316 implemented as one or more motion sensor(s) 1326, or may be additional to, or alternative from, the above described low-power CVM 1316). For example, the A/V device, the hub device 1202, the VA device 1208, and/or one or more component of the network(s) of servers/backend devices 1220 may perform any or all of the computer vision processes and functionalities described herein. In addition, although the CVM 1316 is only illustrated as a component of the A/V device, the computer vision module 1316 may additionally, or alternatively, be included as a component of the hub device 1202, the VA device 1208, and/or one or more components of the network of servers/backend devices 1220. With respect to the A/V device, the CVM 1316 may include any of the components (e.g., hardware) and/or functionality described herein with respect to computer vision, including, without limitation, one or more cameras, sensors, and/or processors. In some of the present embodiments, with reference to FIG. 13, the microphone(s) 1328, the camera 1314, the processor(s) 1310, and/or the image sensor 1336 may be components of the CVM 1316. In some embodiments, the CVM 1316 may include an internal camera, image sensor, and/or processor, and the CVM 1316 may output data to the processor(s) 1310 in an output signal, for example.

Although the A/V recording and communication devices are referred to herein as "audio/video" devices, the A/V devices need not have both audio and video functionality. For example, in some embodiments, the A/V devices may not include the speakers 1330, microphones 1328, and/or audio CODEC. In such examples, the A/V devices may only have video recording and communication functionalities. In other examples, the A/V devices may only have the speaker(s) 1330 and not the microphone(s) 1328, or may only have the microphone(s) 1328 and not the speaker(s) 1330.

The processes 500 and 800, described above, are each illustrated as a collection of blocks in a logical flow graph, which represent a sequence of operations that may be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks may be combined in any order and/or in parallel to implement the processes. Additionally, any number of the described blocks may be optional and eliminated to implement the processes As used herein, the phrases "at least one of A, B and C," "at least one of A, B, or C," and "A, B, and/or C" are synonymous and mean logical "OR" in the computer science sense. Thus, each of the foregoing phrases should be understood to read on (A), (B), (C), (A and B), (A and C), (B and C), and (A and B and C), where A, B, and C are variables representing elements or features of the claim. Also, while these examples are described with three variables (A, B, C) for ease of understanding, the same interpretation applies to similar phrases in these formats with any number of two or more variables.

The above description presents the best mode contemplated for carrying out the present embodiments, and of the manner and process of practicing them, in such full, clear, concise, and exact terms as to enable any person skilled in the art to which they pertain to practice these embodiments. The present embodiments are, however, susceptible to modifications and alternate constructions from those discussed above that are fully equivalent. Consequently, the present invention is not limited to the particular embodiments disclosed. On the contrary, the present invention covers all modifications and alternate constructions coming within the spirit and scope of the present disclosure. For example, the steps in the processes described herein need not be performed in the same order as they have been presented, and may be performed in any order(s). Further, steps that have been presented as being performed separately may in alternative embodiments be performed concurrently. Likewise, steps that have been presented as being performed concurrently may in alternative embodiments be performed separately.

What is claimed is:

1. A method performed by an audio/video recording and communication doorbell device (A/V doorbell) to characterize an electrical circuit including the A/V doorbell, the method comprising:
    electrically coupling a resistor between a first node of the electrical circuit and a second node of the electrical circuit, in a training mode of the A/V doorbell;
    determining a first peak absolute value of magnitude of current flowing through the resistor during a positive half-cycle of the current flowing through the resistor;
    determining a second peak absolute value of the magnitude of the current flowing through the resistor during a negative half-cycle of the current flowing through the resistor;
    determining whether an impedance of the electrical circuit is symmetric based on the first peak absolute value of the magnitude of the current flowing through the resistor and the second peak absolute value of the magnitude of the current flowing through the resistor;
    determining an activation time of a signaling device controlled by the A/V doorbell based on whether the impedance of the electrical circuit is symmetric; and
    bypassing the resistor in a normal operation mode of the A/V doorbell.

2. An audio/video recording and communication doorbell device (A/V doorbell), comprising:
    an input port;
    a first switch and a resistor electrically coupled in series across the input port;
    a bypass switch electrically coupled in parallel with the resistor;
    a first power supply configured to receive power from the input port and at least partially power the A/V doorbell;
    a button configured to be pressed to cause a signaling device to activate; and
    a first controller configured to:
        cause the first switch to close in response to the button being pressed,
        cause the bypass switch to be closed in a first operating mode of the A/V doorbell, and
        cause the bypass switch to be open in a second operating mode of the A/V doorbell.

3. The A/V doorbell of claim 2, wherein the first operating mode of the A/V doorbell is a normal operation mode, and the second operating mode of the A/V doorbell is a training mode.

4. The A/V doorbell of claim 2, wherein the first controller is further configured to:
    sample a first voltage of the A/V doorbell while the bypass switch is closed;
    sample a second voltage of the A/V doorbell while the bypass switch is open; and
    determine an impedance of a circuit including the A/V doorbell from at least the first voltage and the second voltage.

5. The A/V doorbell of claim 4, wherein the first controller is further configured to determine the impedance of the electrical circuit based on a difference between the first voltage and the second voltage.

6. The A/V doorbell of claim 4, wherein the first power supply comprises:
   a bridge rectifier electrically coupled between the input port and a direct current (DC) power rail;
   a capacitor electrically coupled across the DC power rail; and
   a power converter electrically coupled between the DC power rail and a first power rail.

7. The A/V doorbell of claim 6, wherein each of the first voltage and the second voltage is a voltage of the DC power rail.

8. The A/V doorbell of claim 2, wherein:
   the first switch comprises a first transistor and a second transistor electrically coupled in series; and
   each of the first transistor and the second transistor is electrically coupled together at a reference node.

9. The A/V doorbell of claim 8, wherein the first controller is further configured to determine whether the impedance of the electrical circuit is symmetric.

10. The A/V doorbell of claim 9, wherein the first controller is further configured to cause one of the first transistor and the second transistor to continuously operate in its respective on-state, in response to the impedance of the electrical circuit not being symmetric.

11. The A/V doorbell of claim 8, wherein the first controller is further configured to:
    determine a first peak absolute value of magnitude of current flowing through the resistor during a positive half-cycle of the current flowing through the resistor; and
    determine a second peak absolute value of the magnitude of the current flowing through the resistor during a negative half-cycle of the current flowing through the resistor.

12. The A/V doorbell of claim 11, wherein the first controller is further configured to cause the first transistor to continuously operate in its on-state, in response to the first peak absolute value being greater than the second peak absolute value.

13. The A/V doorbell of claim 11, wherein the first controller is further configured to cause the second transistor to continuously operate in its on-state, in response to the second peak absolute value being greater than the first peak absolute value.

14. A method performed by an audio/video recording and communication doorbell device (A/V doorbell) to characterize an electrical circuit including the A/V doorbell, the method comprising:
    sampling a first voltage at the A/V doorbell;
    electrically coupling a resistor between a first node of the electrical circuit and a second node of the electrical circuit;
    sampling a second voltage at the A/V doorbell while the resistor is electrically coupled between the first node of the electrical circuit and the second node of the electrical circuit; and
    determining, from at least the first voltage and the second voltage, an impedance of the electrical circuit.

15. The method of claim 14, further comprising sampling each of the first voltage and the second voltage at an internal power rail of the A/V doorbell.

16. The method of claim 14, further comprising determining the impedance of the electrical circuit based on a difference between the first voltage and the second voltage.

17. The method of claim 14, further comprising determining whether the impedance of the electrical circuit is symmetric.

18. The method of claim 14, further comprising causing a first transistor and a second transistor to operate in their respective on-states, to electrically couple the resistor between the first node of the electrical circuit and the second node of the electrical circuit.

19. The method of claim 18, further comprising:
    determining whether the impedance of the electrical circuit is symmetric; and
    causing one of the first transistor and the second transistor to continuously operate in its respective on-state, in response to the impedance of the electrical circuit not being symmetric.

20. The method of claim 18, further comprising:
    determining a first peak absolute value of magnitude of the current flowing through the resistor during a positive half-cycle of the current flowing through the resistor;
    determining a second peak absolute value of the magnitude of the current flowing through the resistor during a negative half-cycle of the current flowing through the resistor; and
    in response to the first peak absolute value being greater than the second peak absolute value, causing one of the first transistor or the second transistor to continuously operate in its on-state.

* * * * *